(12) United States Patent
Tanaka et al.

(10) Patent No.: US 8,859,187 B2
(45) Date of Patent: Oct. 14, 2014

(54) METHOD OF FORMING RESIST PATTERN AND NEGATIVE RESIST COMPOSITION

(75) Inventors: Ken Tanaka, Kawasaki (JP); Sho Abe, Kawasaki (JP); Shigeru Yokoi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 594 days.

(21) Appl. No.: 12/438,906

(22) PCT Filed: Oct. 19, 2007

(86) PCT No.: PCT/JP2007/070442
§ 371 (c)(1),
(2), (4) Date: Mar. 20, 2009

(87) PCT Pub. No.: WO2008/047905
PCT Pub. Date: Apr. 24, 2008

(65) Prior Publication Data
US 2009/0191478 A1 Jul. 30, 2009

(30) Foreign Application Priority Data
Oct. 20, 2006 (JP) ................................ 2006-286465

(51) Int. Cl.
*G03F 7/095* (2006.01)
*G03F 7/038* (2006.01)
*G03F 7/039* (2006.01)
*G03F 7/20* (2006.01)
*G03F 7/30* (2006.01)

(52) U.S. Cl.
USPC .......... 430/312; 430/311; 430/325; 430/326; 430/907; 430/910

(58) Field of Classification Search
None
See application file for complete search history.

(56) References Cited

U.S. PATENT DOCUMENTS 5,945,517 A    8/1999  Nitta et al.
6,074,801 A *  6/2000  Iwasa et al. ................ 430/270.1
(Continued)

FOREIGN PATENT DOCUMENTS

JP    H09-208554    8/1997
JP    H11-035551    2/1999
(Continued)

OTHER PUBLICATIONS

Derwent English abstract for JP2001-251038 (2001).*
(Continued)

*Primary Examiner* — Sin J. Lee
(74) *Attorney, Agent, or Firm* — Knobbe Martens Olson & Bear LLP

(57) ABSTRACT

A novel method of forming a resist pattern in which thickness loss from the resist pattern is reduced, and a negative resist composition that can be used in this method of forming a resist pattern. The method of forming a resist pattern includes: forming a first resist film by applying a first resist composition to a support, forming a first resist pattern by selectively exposing the first resist film through a first mask pattern and then developing the first resist film, forming a second resist film by applying a negative resist composition containing an ether-based organic solvent (S") having no hydroxyl groups onto the support having the first resist pattern formed thereon, and forming a resist pattern by selectively exposing the second resist film through a second mask pattern and then developing the second resist film.

19 Claims, 2 Drawing Sheets

(56) References Cited

U.S. PATENT DOCUMENTS

| | | | |
|---|---|---|---|
| 6,153,733 A | 11/2000 | Yukawa et al. | |
| 7,074,543 B2 | 7/2006 | Iwai et al. | |
| 7,323,287 B2 | 1/2008 | Iwai et al. | |
| 8,263,322 B2 * | 9/2012 | Ando | 430/324 |
| 2001/0036594 A1 * | 11/2001 | Kozawa et al. | 430/270.1 |
| 2002/0058197 A1 * | 5/2002 | Nozaki et al. | 430/270.1 |
| 2003/0129543 A1 | 7/2003 | Hwang et al. | |
| 2004/0058270 A1 * | 3/2004 | Iwai et al. | 430/270.1 |
| 2007/0066775 A1 | 3/2007 | Rhodes et al. | |
| 2007/0224520 A1 | 9/2007 | Ogata et al. | |
| 2008/0153300 A1 * | 6/2008 | Bok | 438/703 |
| 2009/0130590 A1 | 5/2009 | Chen et al. | |
| 2009/0191478 A1 | 7/2009 | Tanaka et al. | |
| 2009/0253084 A1 | 10/2009 | Takemura et al. | |
| 2009/0305163 A1 * | 12/2009 | Iwashita et al. | 430/286.1 |

FOREIGN PATENT DOCUMENTS

| | | |
|---|---|---|
| JP | H11-035552 | 2/1999 |
| JP | H11-035573 | 2/1999 |
| JP | H11-322707 | 11/1999 |
| JP | A-2001-251038 | 9/2001 |
| JP | 2003-241385 | 8/2003 |
| JP | 2005-325325 | 11/2005 |
| JP | 2006-145788 A | 6/2006 |
| JP | 2006-163066 A | 6/2006 |
| JP | 2006-165328 | 6/2006 |
| JP | 2006-259582 A | 9/2006 |
| JP | A-2009-251216 | 10/2009 |
| JP | A-2010-060693 | 3/2010 |
| WO | WO 2004/074242 | 9/2004 |
| WO | WO 2004/076495 A2 | 9/2004 |
| WO | WO 2006/054432 A1 | 5/2006 |
| WO | WO 2006/061975 A1 | 6/2006 |
| WO | WO 2008/047905 | 4/2008 |

OTHER PUBLICATIONS

Machine-assisted English translation of JP2001-251038 (2001), provided by JPO.*

Ebihara, Takeaki, Beyond k1=0.25 lithography : 70nm L/S patterning using KrF scanners, Proceedings of SPIE vol. 5256 23rd Annual BACUS Symposium on Photomask Technology, pp. 985 to 994 (2003).

Borodovsky, Yan, Marching to the beat of Moore's Law, Proceedings of SPIE vol. 6153, pp. 615301-1 to 615301-19 (2006).

Gil, D. et al. First Microprocessors with Immersion Lithography, Proceedings of SPIE vol. 5754, pp. 119-128 (2005).

International Search Report issued for corresponding PCT Application No. PCT/JP2007/070442, dated Nov. 20, 2007.

Office Action in U.S. Appl. No. 12/569,040 mailed Sep. 29, 2011.

Office Action issued in Japanese Patent Application No. 2008-256295 on Oct. 30, 2012.

* cited by examiner

US 8,859,187 B2

METHOD OF FORMING RESIST PATTERN AND NEGATIVE RESIST COMPOSITION

RELATED APPLICATIONS

This application is the U.S. National Phase filing under 35 U.S.C. §371 of PCT/JP2007/070442, filed Oct. 19, 2007, which designated the United States and was published in a language other than English, which claims priority under 35 U.S.C. §119(a)-(d) to Japanese Patent Application No. 2006-286465, filed Oct. 20, 2006. The contents of these applications are incorporated herein by reference in their entireties.

TECHNICAL FIELD

The present invention relates to a method of forming a resist pattern, and a negative resist composition that can be used in the method of forming a resist pattern.

Priority is claimed on Japanese Patent Application No. 2006-286465, filed Oct. 20, 2006, the content of which is incorporated herein by reference.

Priority is claimed on Japanese Patent Application No. 2006-286465, filed Oct. 20, 2006, the content of which is incorporated herein by reference.

BACKGROUND ART

Techniques (pattern-forming techniques) in which a fine pattern is formed on top of a substrate, and a lower layer beneath that pattern is then fabricated by conducting etching with this pattern as a mask are widely used in the semiconductor industry for IC fabrication and the like, and are attracting considerable attention.

These types of fine patterns are typically formed from an organic material, and are formed, for example, using a lithography method or a nanoimprint method or the like. For example, in the case of a lithography method, a process is conducted in which a resist film formed from a resist composition containing a base component such as a resin is formed on top of a support such as a substrate, the resist film is subjected to selective exposure using radiation such as light or an electron beam, through a mask in which a predetermined pattern has been formed (a mask pattern), and a developing treatment is then conducted, thereby forming a resist pattern of predetermined shape in the resist film. Resist compositions in which the exposed portions change to become soluble in the developing solution are termed positive compositions, whereas resist compositions in which the exposed portions change to become insoluble in the developing solution are termed negative compositions.

Then, using this resist pattern as a mask, a semiconductor device or the like is produced by conducting a step in which the substrate is processed by etching.

In recent years, advances in lithography techniques have lead to rapid progress in the field of pattern miniaturization. Typically, these miniaturization techniques involve shortening the wavelength of the exposure light source. Conventionally, ultraviolet radiation typified by g-line and i-line radiation has been used, but nowadays semiconductor device mass production using KrF excimer lasers and ArF excimer lasers has already commenced, and for example, lithography using ArF excimer lasers has enabled pattern formation with resolution at the 45 nm level. Furthermore, in order to further improve the resolution, research is also being conducted into lithography techniques that use exposure light sources having a wavelength shorter than these excimer lasers, such as $F_2$ excimer lasers, electron beams, EUV (extreme ultraviolet radiation), and X rays.

The resist composition requires lithography properties such as a high level of sensitivity to these types of exposure sources, and a high resolution capable of reproducing patterns of minute dimensions. As a resist composition which satisfies these requirements, a chemically amplified resist composition is used, which includes a base component that exhibits changed alkali solubility under the action of acid, and an acid generator that generates acid upon exposure (for example, see Patent Document 1). For example, a positive chemically amplified resist typically contains, as a base component, a resin which exhibits increased alkali solubility under the action of acid, and during formation of a resist pattern, when acid is generated from the acid generator upon exposure, the exposed portions of the resist become alkali-soluble.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see, for example, Non-Patent Document 1).

According to this type of immersion exposure, it is considered that higher resolutions equivalent to those obtained using a shorter wavelength light source or a larger NA (numerical aperture) lens can be achieved using the same exposure light source wavelength, with no lowering of the depth of focus. Furthermore, immersion exposure can be conducted using existing exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift methods and modified illumination methods. Currently, as the immersion exposure technique, techniques using an ArF excimer laser as an exposure source are being the most actively studied. Further, water is mainly being investigated as the immersion medium.

Recently, a new lithography technique called the double patterning method has been proposed, in which a resist pattern is formed by conducting patterning two or more times (see, for example, Non-Patent Documents 2 and 3).

According to this double patterning method, it is thought that by forming a first resist pattern on a support using a first resist composition, and subsequently conducting additional patterning using a second resist composition formed on top of the support having the first resist pattern formed thereon, a resist pattern can be formed that has a higher resolution than a resist pattern formed using only a single patterning step.

[Patent Reference 1]
Japanese Unexamined Patent Application, First Publication No. 2003-241385
[Non-Patent Document 1]
Proceedings of SPIE, vol. 5754, pp. 119 to 128 (2005)

[Non-Patent Document 2]
Proceedings of SPIE, vol. 5256, pp. 985 to 994 (2003)
[Non-Patent Document 3]
Proceedings of SPIE, vol. 6153, pp. 1 to 19 (2006)

DISCLOSURE OF INVENTION

Problems to be Solved by the Invention

However currently, if a resist pattern is formed using the type of double patterning method described above, then when the second resist composition is applied to the support having the first resist pattern already formed thereon, so-called "mixing" in which the first resist pattern and the second resist composition dissolve within each other tends to occur, which causes problems such as thickness loss from the first resist pattern.

Here, the term "thickness loss" describes the change in the film thickness of the first resist pattern between the state before application of the second resist composition and the state following application. A smaller value for this thickness loss indicates that the first resist pattern is less affected by the second resist composition, and means that following double patterning, the shape of the first resist pattern is favorably retained.

The present invention takes the above circumstances into consideration, with an object of providing a novel method of forming a resist pattern in which thickness loss from the resist pattern is reduced, and a negative resist composition that can be used in this method of forming a resist pattern.

Means for Solving the Problems

In order to achieve the above object, the present invention adopts the aspects described below.

A first aspect of the present invention is a method of forming a resist pattern, including: forming a first resist film by applying a first resist composition to a support, forming a first resist pattern by selectively exposing the first resist film through a first mask pattern and then developing the first resist film, forming a second resist film by applying a negative resist composition containing an ether-based organic solvent (S") having no hydroxyl groups onto the support having the first resist pattern formed thereon, and forming a resist pattern by selectively exposing the second resist film through a second mask pattern and then developing the second resist film.

A second aspect of the present invention is a negative resist composition that can be used as a second resist composition within a method of forming a resist pattern that includes: forming a first resist film by applying a first resist composition to a support, forming a first resist pattern by selectively exposing the first resist film through a first mask pattern and then developing the first resist film, forming a second resist film by applying the second resist composition onto the support having the first resist pattern formed thereon, and forming a resist pattern by selectively exposing the second resist film through a second mask pattern and then developing the second resist film, wherein the negative resist composition contains an ether-based organic solvent (S") having no hydroxyl groups.

In this description and within the scope of the appended claims, the term "exposure" is a general concept that includes irradiation with any form of radiation.

Effect of the Invention

The present invention is able to provide a novel method of forming a resist pattern in which thickness loss from the resist pattern is reduced, and a negative resist composition that can be used in this method of forming a resist pattern.

DESCRIPTION OF THE REFERENCE SYMBOLS

Figure 1A:
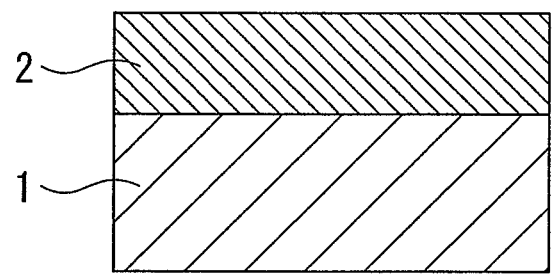
FIG. 1A is a schematic process diagram describing a preferred embodiment of a method of forming a resist pattern according to the present invention.

1 Support
2 First resist film
3 First resist pattern
6 Second resist film
7 Second resist pattern

BEST MODE FOR CARRYING OUT THE INVENTION

<<Method of Forming Resist Pattern>>

A method of forming a resist pattern according to the present invention is a method that uses a first resist composition, and a negative resist composition as a second resist composition.

The first resist composition and the second resist composition (the negative resist composition) are preferably both chemically amplified resist compositions.

There are no particular restrictions on these chemically amplified resist compositions, which may be selected from the multitude of conventional chemically amplified resist compositions that have been proposed for use as resist compositions, in accordance with factors such as the type of exposure light source being used and the lithography properties.

As the chemically amplified resist composition, a composition containing a base component (A) that exhibits changed alkali solubility under the action of acid (hereafter frequently referred to as "component (A)") and an acid generator component (B) that generates acid upon exposure (hereafter frequently referred to as "component (B)") dissolved in an organic solvent (S) (hereafter frequently referred to as "component (S)") is typical.

[Component (A)]

In the component (A), the term "base component" describes an organic compound having a film-forming ability, which is preferably an organic compound having a molecular weight of 500 or more. When the organic compound has a molecular weight of 500 or more, the film-forming ability is improved, and a nano level pattern can be more easily formed.

These organic compounds having a molecular weight of 500 or more are broadly classified into low molecular weight organic compounds having a molecular weight of at least 500 but not more than 2,000 (hereafter, frequently referred to as "low molecular weight compounds") and high molecular weight resins (polymers) having a molecular weight greater than 2,000. Generally, as the aforementioned low molecular weight compound, a non-polymer is used. In the case of a resin (polymer), the "molecular weight" is reported as the polystyrene equivalent weight average molecular weight (Mw) determined by GPC (gel permeation chromatography). Hereafter, the simplified term "resin" is used to refer to a resin having a molecular weight greater than 2,000.

The component (A) may be a low molecular weight compound that exhibits changed alkali solubility under the action of acid, a resin that exhibits changed alkali solubility under the action of acid, or a mixture thereof.

As the component (A), generally, either a single organic compound that is typically used as a base component for a chemically amplified resist is used alone, or a mixture of two or more such compounds may be used.

As the component (A) of the chemically amplified resist composition used in the present invention, a component having a hydrophilic group is preferred. The hydrophilic group within the component (A) is preferably one or more groups selected from the group consisting of a hydroxyl group, carboxyl group, carbonyl group (—C(O)—), ester group (an ester linkage: —C(O)—O—), amino group and amide group. Of these groups, a hydroxyl group (and particularly an alcoholic hydroxyl group or a phenolic hydroxyl group), a carboxyl group, and an ester group are more preferred, and a carboxyl group, an alcoholic hydroxyl group and a phenolic hydroxyl group are particularly desirable.

In the present invention, the terms "structural unit" and "unit" refer to a monomer unit that contributes to the formation of a resin (polymer).

<First Resist Composition>

The chemically amplified resist composition used as the first resist composition may be either a negative resist composition or a positive resist composition, although a positive resist composition is preferred.

Of the various possibilities, the first resist composition is preferably a positive resist composition including a base component (A') that exhibits increased alkali solubility under the action of acid, and an acid generator component (B) that generates acid upon exposure.

When the chemically amplified resist composition used as the first resist composition is a negative resist composition, an alkali-soluble base component is used as the component (A), and a cross-linker component is also blended into the negative resist composition.

Examples of the component (A) and the cross-linker component in this negative resist composition include the same materials as those exemplified below for an alkali-soluble resin component (A") and a cross-linker component (C) of a negative resist composition used as the second resist composition described below.

When the chemically amplified resist composition used as the first resist composition is a positive resist composition, a base component (A') that has acid-dissociable, dissolution-inhibiting groups and exhibits increased alkali solubility under the action of acid is used as the component (A).

The positive resist composition is alkali-insoluble prior to exposure, but during resist pattern formation, when acid is generated from the component (B) upon exposure, the acid-dissociable, dissolution-inhibiting groups are dissociated by the action of the generated acid, and the component (A') becomes alkali-soluble. Accordingly, during the formation of a resist pattern, by conducting selective exposure of a resist film obtained by applying the positive resist composition onto a support such as a substrate, the exposed portions become alkali-soluble, whereas the unexposed portions remain alkali-insoluble, meaning alkali developing can then be conducted.

As the component (A') of the positive resist composition, a component that includes both a hydrophilic group and an acid-dissociable, dissolution-inhibiting group is preferred, and a component (A-1) and/or a component (A-2) described below are particularly desirable.

The hydrophilic group may also act as the acid-dissociable, dissolution-inhibiting group.

Component (A-1): a resin having hydrophilic groups and acid-dissociable, dissolution-inhibiting groups.

Component (A-2): a low-molecular compound having a hydrophilic group and an acid-dissociable, dissolution-inhibiting group.

Preferred embodiments of the component (A-1) and the component (A-2) are described below in more detail.

Component (A-1)

As the component (A-1), a resin containing a structural unit having a hydrophilic group and a structural unit having an acid-dissociable, dissolution-inhibiting group is preferred.

In this resin, the proportion of the structural unit having a hydrophilic group, relative to the combined total of all the structural units that constitute the resin, is preferably within a range from 20 to 80 mol %, more preferably from 20 to 70 mol %, and still more preferably from 20 to 60 mol %.

The proportion within the resin of the structural unit having an acid-dissociable, dissolution-inhibiting group, relative to the combined total of all the structural units that constitute the resin, is preferably within a range from 20 to 80 mol %, more preferably from 20 to 70 mol %, and still more preferably from 30 to 60 mol %.

The structural unit having a hydrophilic group is preferably a structural unit having a carboxyl group, an ester group, an alcoholic hydroxyl group or a phenolic hydroxyl group. Specific examples of preferred units include structural units derived from acrylic acid, structural units derived from acrylate esters, structural units derived from (α-lower alkyl)acrylate esters having an alcoholic hydroxyl group, and structural units derived from hydroxystyrene.

In the present specification, the term "acrylic acid" is used as a generic term that includes not only acrylic acid ($CH_2=CH—COOH$) in which a hydrogen atom is bonded to the α-position carbon atom, but also compounds in which a substituent (an atom other than a hydrogen atom or a group) is bonded to the α-position carbon atom.

The term "acrylate ester" is used as a generic term that includes not only the acrylate ester in which a hydrogen atom is bonded to the α-position carbon atom, but also esters in which a substituent (an atom other than a hydrogen atom or a group) is bonded to the α-position carbon atom.

The term "acrylate" is sometimes used as a generic term that includes not only the acrylate ester in which a hydrogen atom is bonded to the α-position carbon atom, but also esters in which a substituent (an atom other than a hydrogen atom or a group) is bonded to the α-position carbon atom.

In the terms "acrylic acid", "acrylate ester" and "acrylate", the "α-position (the carbon atom on the α-position)" refers to the carbon atom having the carbonyl group bonded thereto, unless specified otherwise.

A "structural unit derived from acrylic acid" is a structural unit that is formed by cleavage of the ethylenic double bond of acrylic acid.

A "structural unit derived from an acrylate ester" is a structural unit that is formed by cleavage of the ethylenic double bond of an acrylate ester.

In an "acrylic acid", an "acrylate ester" or an "acrylate", examples of the substituent include a halogen atom, a lower alkyl group, or a halogenated lower alkyl group. Examples of the halogen atom include a fluorine atom, chlorine atom, bromine atom or iodine atom, and a fluorine atom is particularly preferable.

The term "alkyl group" includes linear, branched and cyclic monovalent saturated hydrocarbon groups, unless stated otherwise.

A "lower alkyl group" describes an alkyl group of 1 to 5 carbon atoms.

In an "acrylic acid" or "acrylate ester", specific examples of the lower alkyl group for the α-position substituent include linear or branched lower alkyl groups such as a methyl group, ethyl group, propyl group, isopropyl group, n-butyl group, isobutyl group, tert-butyl group, pentyl group, isopentyl group, and neopentyl group. In terms of industrial availability, a hydrogen atom or a methyl group is preferred.

In the present invention, it is preferable that a hydrogen atom, a halogen atom, a lower alkyl group or a halogenated lower alkyl group, and more preferably a hydrogen atom, a fluorine atom, a lower alkyl group or a fluorinated lower alkyl group, and still more preferably a hydrogen atom or a lower alkyl group, is bonded to the α-position of the acrylate ester. In terms of industrial availability, a hydrogen atom or a methyl group is the most desirable.

The term "(α-lower alkyl)acrylic acid" refers to one or both of acrylic acid ($CH_2=CH-COOH$) and α-lower alkyl acrylic acid.

An "α-lower alkyl acrylic acid" refers to a compound in which the hydrogen atom bonded to the carbon atom that is bonded to the carbonyl group of the acrylic acid is substituted with a lower alkyl group.

An "(α-lower alkyl)acrylate ester" is an ester derivative of the "(α-lower alkyl)acrylic acid", and refers to one or both of the acrylate ester and the α-lower alkyl acrylate ester.

A "structural unit derived from an (α-lower alkyl)acrylate ester" is a structural unit that is formed by cleavage of the ethylenic double bond of an (α-lower alkyl)acrylate ester, and hereafter may also be referred to as an "(α-lower alkyl)acrylate structural unit".

The term "(α-lower alkyl)acrylate" refers to one or both of the acrylate and the α-lower alkyl acrylate.

A "structural unit derived from hydroxystyrene" is a structural unit that is formed by cleavage of the ethylenic double bond of hydroxystyrene or an α-lower alkyl hydroxystyrene, and hereafter may also be referred to as a "hydroxystyrene unit".

An "α-lower alkyl hydroxystyrene" refers to a compound in which a lower alkyl group is bonded to the carbon atom to which the phenyl group is bonded.

As the component (A-1), more specifically, novolak resins, hydroxystyrene-based resins, (α-lower alkyl)acrylate ester resins, and copolymer resins containing structural units derived from hydroxystyrene and structural units derived from an (α-lower alkyl) acrylate ester, which contain a hydrophilic group and an acid-dissociable, dissolution-inhibiting group, can be used favorably.

Although there are no particular restrictions on preferred resin components for use as the component (A-1), examples include resin components (hereafter frequently referred to as "component (A-11)") that include a unit containing a phenolic hydroxyl group, such as a structural unit (a1) described below, a structural unit containing an acid-dissociable, dissolution-inhibiting group, such as one or more units selected from the group consisting of a structural unit (a2) described below and a structural unit (a3) described below, and where necessary an alkali-insoluble unit such as a structural unit (a4).

In the component (A-11), the action of the acid generated from the acid generator upon exposure causes cleavage within the structural unit (a2) and/or the structural unit (a3), and this causes the resin, which was initially insoluble in an alkali developing solution, to undergo an increase in alkali solubility. As a result, exposure and developing can be used to form a chemically amplified positive pattern.

Structural Unit (a1)

The structural unit (a1) is a unit that contains a phenolic hydroxyl group, and is preferably a unit derived from hydroxystyrene, represented by general formula (I) shown below.

[Chemical Formula 1]

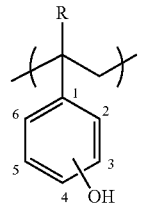

(I)

wherein R represents a hydrogen atom or a lower alkyl group.

R represents either a hydrogen atom or a lower alkyl group. The lower alkyl group is as defined above. A hydrogen atom or a methyl group is preferred. This definition of R also applies below.

There are no particular restrictions on the bonding position of the —OH group to the benzene ring, although the position labeled 4 in the formula (the para position) is preferred.

From the viewpoint of forming a favorable pattern, the quantity of the structural unit (a1) within the component (A-11) is typically within a range from 40 to 80 mol %, and is preferably from 50 to 75 mol %. By ensuring that this quantity is at least 40 mol %, the solubility of the component in an alkali developing solution can be improved, and a favorable improvement in the pattern shape can also be obtained. Ensuring that the quantity is not more than 80 mol % enables a favorable balance to be achieved with the other structural units.

Structural Unit (a2)

The structural unit (a2) is a structural unit containing an acid-dissociable, dissolution-inhibiting group, and is represented by general formula (II) shown below.

[Chemical Formula 2]

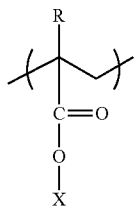

(II)

wherein R is as defined above, and X represents an acid-dissociable, dissolution-inhibiting group.

Examples of the acid-dissociable, dissolution-inhibiting group X include alkyl groups having a tertiary carbon atom in which the tertiary carbon atom of the tertiary alkyl group is bonded to the ester group [—C(O)O—], as well as cyclic acetal groups such as a tetrahydropyranyl group or a tetrahydrofuranyl group.

Besides the groups described above, any of the groups typically used within conventional chemically amplified positive resist compositions may also be used as the acid-dissociable, dissolution-inhibiting group X.

As the structural unit (a2), units such as those represented by general formula (III) shown below are preferred.

[Chemical Formula 3]

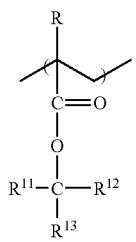

(III)

In this formula, R is as defined above, $R^{11}$, $R^{12}$ and $R^{13}$ each independently represents a lower alkyl group (which may be linear or branched, and is preferably a lower alkyl group of 1 to 5 carbon atoms). Furthermore, of the groups $R^{11}$, $R^{12}$ and $R^{13}$, $R^{11}$ may represent a lower alkyl group, and $R^{12}$ and $R^{13}$ may be bonded together to form a monocyclic or polycyclic aliphatic cyclic group. The number of carbon atoms within this aliphatic cyclic group is preferably from 5 to 12.

Here, the term "aliphatic" defines a group or compound that has no aromaticity, and an "aliphatic cyclic group" refers to a monocyclic or polycyclic group that has no aromaticity.

In those cases where $R^{11}$, $R^{12}$ and $R^{13}$ do not include an aliphatic cyclic group, units in which $R^{11}$, $R^{12}$ and $R^{13}$ all represent methyl groups are preferred.

In those cases where $R^{11}$, $R^{12}$ and $R^{13}$ do include an aliphatic cyclic group, the number of carbon atoms within the aliphatic cyclic group is preferably from 5 to 12. In those cases where the aliphatic cyclic group is a monocyclic aliphatic cyclic group, units having a cyclopentyl group or cyclohexyl group are preferred as the structural unit (a2). In those cases where the aliphatic cyclic group is a polycyclic aliphatic cyclic group, units having an adamantyl group or the like are preferred as the structural unit (a2).

In those cases where the aliphatic cyclic group formed by each of or by the bonding of two of $R^{11}$, $R^{12}$ and $R^{13}$ is a polycyclic alicyclic group, examples of preferred forms of the structural unit (a2) include those units represented by general formula (IV) shown below.

[Chemical Formula 4]

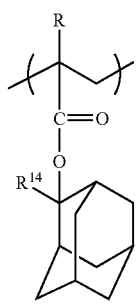

(IV)

wherein R is as defined above, and $R^{14}$ represents a lower alkyl group (which may be linear or branched, and preferably contains from 1 to 5 carbon atoms).

Furthermore, as a structural unit containing an acid-dissociable, dissolution-inhibiting group that includes a polycyclic aliphatic cyclic group, units represented by general formula (V) shown below are also preferred.

[Chemical Formula 5]

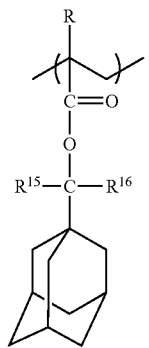

(V)

wherein R is as defined above, and $R^{15}$ and $R^{16}$ each independently represents a lower alkyl group (which may be linear or branched, and preferably contains from 1 to 5 carbon atoms).

The quantity of the structural unit (a2) within the component (A-11) is typically within a range from 5 to 50 mol %, and is preferably from 10 to 40 mol %, and more preferably from 10 to 35 mol %.

Structural Unit (a3)

The structural unit (a3) is a structural unit containing an acid-dissociable, dissolution-inhibiting group, and is represented by general formula (VI) shown below.

[Chemical Formula 6]

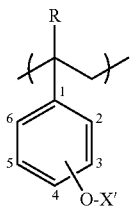

(VI)

wherein R is as defined above, and X' represents an acid-dissociable, dissolution-inhibiting group.

Examples of the acid-dissociable, dissolution-inhibiting group X' include tertiary alkyloxycarbonyl groups such as a tert-butyloxycarbonyl group or tert-amyloxycarbonyl group; tertiary alkyloxycarbonylalkyl groups such as a tert-butyloxycarbonylmethyl group or tert-butyloxycarbonylethyl group; tertiary alkyl groups such as a tert-butyl group or tert-amyl group; cyclic acetal groups such as a tetrahydropyranyl group or tetrahydrofuranyl group; and alkoxyalkyl groups such as an ethoxyethyl group or methoxypropyl group.

Of these groups, a tert-butyloxycarbonyl group, tert-butyloxycarbonylmethyl group, tert-butyl group, tetrahydropyranyl group or ethoxyethyl group is preferred.

Besides the groups listed above, other groups typically used in conventional chemically amplified positive resist compositions may also be used as the acid-dissociable, dissolution-inhibiting group X'.

In general formula (VI), there are no particular restrictions on the position at which the (—OX') group is bonded to the benzene ring, although bonding at the position labeled 4 in the above formula (the para position) is preferred.

The quantity of the structural unit (a3) within the component (A-11) is typically within a range from 5 to 50 mol %, and is preferably from 10 to 40 mol %, and more preferably from 10 to 35 mol %.

Structural Unit (a4)

The structural unit (a4) is an alkali-insoluble unit, and is represented by general formula (VII) shown below.

[Chemical Formula 7]

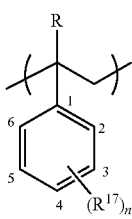

(VII)

wherein R is as defined above, $R^{17}$ represents a lower alkyl group, and n' represents either 0 or an integer of 1 to 3.

The lower alkyl group of $R^{17}$ may be either linear or branched, and preferably contains 1 to 5 carbon atoms.

n' is either 0 or an integer of 1 to 3, and is preferably 0.

The quantity of the structural unit (a4) within the component (A-11) is typically within a range from 1 to 40 mol %, and is preferably from 5 to 25 mol %. By ensuring this quantity is at least 1 mol %, the level of improvement in the shape (and particularly the improvement in thickness loss) is enhanced, whereas ensuring that the quantity is not more than 40 mol % enables a favorable balance to be achieved with the other structural units.

The component (A-11) must contain the structural unit (a1) and at least one structural unit selected from the group consisting of the structural unit (a2) and the structural unit (a3), and may also contain a structural unit (a4). Furthermore, the component (A-11) may be a copolymer containing all of the structural units, or a mixture of a plurality of different polymers each containing at least one of the structural units. Combinations of these two possibilities are also possible.

Furthermore, the component (A-11) may also include other units besides the structural units (a1), (a2), (a3) and (a4) described above, although the structural units (a1), (a2), (a3) and (a4) preferably represent at least 80 mol %, and even more preferably at least 90 mol % (and most preferably 100 mol %) of the component (A-11).

Embodiments that use "a single copolymer containing the structural unit (a1) and the structural unit (a3), or a mixture of two or more different copolymers of this type", or "a single copolymer containing the structural units (a1), (a2) and (a4), or a mixture of two or more different copolymers of this type", or a mixture of these two embodiments offer a simple way of achieving the desired effects, and are therefore the most preferred. Furthermore, these embodiments also offer a favorable improvement in the heat resistance.

A mixture of a polyhydroxystyrene protected with tertiary alkyloxycarbonyl groups and a polyhydroxystyrene protected with 1-alkoxyalkyl groups is particularly desirable. During mixing, the mixing ratio (weight ratio) between these copolymers (polyhydroxystyrene protected with tertiary alkyloxycarbonyl groups/polyhydroxystyrene protected with 1-alkoxyalkyl groups) is typically within a range from 1/9 to 9/1, and is preferably from 2/8 to 8/2, and more preferably from 2/8 to 5/5.

In terms of enabling formation of a resist pattern with a higher etching resistance, as a resin component that is suitable as the component (A-1) but is different from the component (A-11) described above, a resin component that contains an acrylate ester resin is preferred, a resin component that contains an (α-lower alkyl)acrylate ester resin (namely, an (α-lower alkyl)acrylate ester resin) is more preferred, and a resin component formed solely from an (α-lower alkyl)acrylate ester resin is particularly desirable.

Of these acrylate ester resins, a resin component (hereafter referred to as "component (A-12)") containing a structural unit derived from an acrylate ester containing an acid-dissociable, dissolution-inhibiting group (hereafter abbreviated as "structural unit (a5)") is preferred, and a resin component containing a structural unit derived from an (α-lower alkyl) acrylate ester containing an acid-dissociable, dissolution-inhibiting group is particularly desirable. The α-lower alkyl group is as defined above.

The acid-dissociable, dissolution-inhibiting group of the structural unit (a5) has an alkali dissolution-inhibiting effect that renders the entire component (A-12) alkali-insoluble prior to exposure, but then dissociates following exposure as a result of the action of the acid generated from the component (B), causing the entire component (A-12) to change to an alkali-soluble state.

Furthermore, in the (α-lower alkyl)acrylate ester resin component, when the acid-dissociable, dissolution-inhibiting group within the structural unit (a5) dissociates under the action of the acid generated from the component (B), a carboxylic acid is generated. The presence of this generated carboxylic acid improves the adhesion with a coating film formed on top of the resist pattern.

As the acid-dissociable, dissolution-inhibiting group, any of the multitude of groups that have been proposed for the resins used within resist compositions designed for use with ArF excimer lasers can be used. Generally, groups that form a cyclic or chain-like tertiary alkyl ester with the carboxyl group of the (α-lower alkyl)acrylic acid, or cyclic or chain-like alkoxyalkyl groups are the most widely known.

Here, a "group that forms a tertiary alkyl ester" describes a group that forms an ester by substituting the hydrogen atom of the acrylic acid carboxyl group. In other words, a structure in which the tertiary carbon atom of a chain-like or cyclic tertiary alkyl group is bonded to the oxygen atom at the terminal of the carbonyloxy group [—C(O)—O—] of the acrylate ester. In this tertiary alkyl ester, the action of acid causes cleavage of the bond between the oxygen atom and the tertiary carbon atom.

A tertiary alkyl group refers to an alkyl group that includes a tertiary carbon atom, and preferably an alkyl group of 4 to 20 carbon atoms.

Examples of groups that form a chain-like tertiary alkyl ester include alkyl groups of 4 to 8 carbon atoms, such as a tert-butyl group and a tert-amyl group.

Examples of groups that form a cyclic tertiary alkyl ester include the same groups as those exemplified below in relation to the "acid-dissociable, dissolution-inhibiting group that contains an alicyclic group". The number of carbon atoms within this group is preferably within a range from 6 to 20.

A "cyclic or chain-like alkoxyalkyl group" forms an ester by substitution of the hydrogen atom of a carboxyl group. In other words, a structure is formed in which the alkoxyalkyl group is bonded to the oxygen atom at the terminal of the carbonyloxy group [—C(O)—O—] of the acrylate ester. In this structure, the action of acid causes cleavage of the bond between the oxygen atom and the alkoxyalkyl group.

As this type of cyclic or chain-like alkoxyalkyl group, groups of 2 to 12 carbon atoms are preferred, such as a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a5), structural units that include an acid-dissociable, dissolution-inhibiting group that contains a cyclic group, and particularly an aliphatic cyclic group, are preferred.

Here, the terms "aliphatic" and "aliphatic cyclic group" are as defined above.

The aliphatic cyclic group may be either monocyclic or polycyclic, and can be selected appropriately from the multitude of groups proposed for use within ArF resists and the like. From the viewpoint of ensuring favorable etching resistance, a polycyclic alicyclic group is preferred. Furthermore, the alicyclic group is preferably a hydrocarbon group, and is even more preferably a saturated hydrocarbon group (an alicyclic group).

Examples of the monocyclic alicyclic groups include groups in which one hydrogen atom has been removed from a cycloalkane. Examples of the polycyclic alicyclic groups include groups in which one hydrogen atom has been removed from a bicycloalkane, tricycloalkane or tetracycloalkane or the like.

Specifically, examples of the monocyclic alicyclic groups include groups of 5 to 8 carbon atoms such as a cyclopentyl group or cyclohexyl group. Examples of the polycyclic alicyclic groups include groups in which one hydrogen atom has been removed from a polycycloalkane such as adamantane, norbornane, isobornane, tricyclodecane or tetracyclododecane, and groups of 7 to 20 carbon atoms are preferred.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a5) is preferably at least one unit selected from general formulas (I') to (III') shown below.

Furthermore, the structural unit (a5) is preferably a unit derived from an (α-lower alkyl)acrylate ester which contains an aforementioned cyclic alkoxyalkyl group at the ester portion, and more specifically, is preferably at least one structural unit selected from amongst units derived from an aliphatic polycyclic alkyloxy lower alkyl (α-lower alkyl)acrylate ester that may contain a substituent, such as a2-adamantoxymethyl group, 1-methyladamantoxymethyl group, 4-oxo-2-adamantoxymethyl group, 1-adamantoxyethyl group or 2-adamantoxyethyl group.

[Chemical Formula 8]

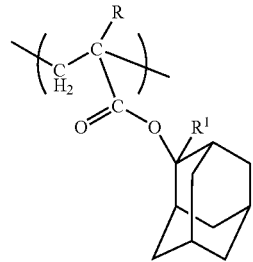

(I')

wherein R is as defined above, and $R^1$ represents a lower alkyl group.

[Chemical Formula 9]

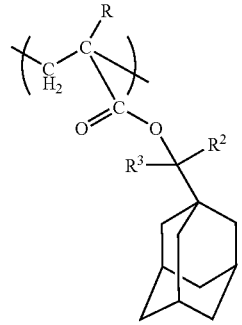

(II')

wherein R is as defined above, and $R^2$ and $R^3$ each independently represents a lower alkyl group.

[Chemical Formula 10]

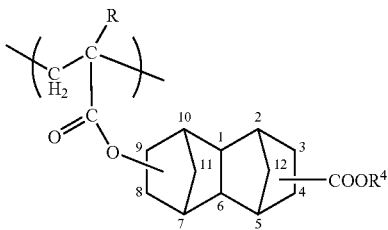

(III')

wherein R is as defined above, and $R^4$ represents a tertiary alkyl group.

In general formulas (I') to (III'), the hydrogen atom or lower alkyl group represented by R is the same as that described above in relation to the hydrogen atom or lower alkyl group bonded to the C-position of an acrylate ester.

The lower alkyl group for $R^1$ is preferably a linear or branched alkyl group of 1 to 5 carbon atoms, and specific examples include a methyl group, ethyl group, propyl group, isopropyl group, n-butyl group, isobutyl group, pentyl group, isopentyl group or neopentyl group. Of these, a methyl group or an ethyl group is preferred in terms of industrial availability, and a methyl group is particularly preferred.

The lower alkyl groups for $R^2$ and $R^3$ each preferably independently represents a linear or branched alkyl group of 1 to 5 carbon atoms. Of the various possibilities, those cases in which $R^2$ and $R^3$ are both methyl groups are preferred industrially. A structural unit derived from 2-(1-adamantyl)-2-propyl acrylate is a specific example.

The group $R^4$ is a chain-like tertiary alkyl group or a cyclic tertiary alkyl group. The chain-like tertiary alkyl group is preferably an alkyl group of 4 to 8 carbon atoms, and examples include a tert-butyl group or tert-amyl group, although a tert-butyl group is preferred industrially Examples of the cyclic tertiary alkyl group include the same groups as those exemplified above in relation to the "acid-dissociable, dissolution-inhibiting group that contains an aliphatic cyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group and 1-methylcyclopentyl group. Groups of 6 to 21 carbon atoms are preferred.

Furthermore, the group —$COOR^4$ may be bonded to either position 3 or 4 of the tetracyclododecanyl group shown in the formula, although the bonding position cannot be further specified. Furthermore, in a similar manner, the carboxyl group residue of the acrylate structural unit may be bonded to either position 8 or 9 within the formula.

The structural unit (a5) may be used as either a single structural unit or a combination of two or more different structural units.

The proportion of the structural unit (a5) within the component (A-12), relative to the combined total of all the structural units that constitute the component (A-12), is preferably within a range from 20 to 60 mol %, more preferably from 25 to 50 mol %, and is most preferably from 30 to 45 mol %. By ensuring that this proportion is at least as large as the lower limit of the above-mentioned range, a favorable resist pattern can be obtained, whereas ensuring that the proportion is not greater than the upper limit of the above-mentioned range enables a favorable balance to be achieved with the other structural units.

The component (A-12) preferably also includes, in addition to the structural unit (a5) described above, a structural unit derived from an acrylate ester that contains a lactone-containing cyclic group (hereafter abbreviated as "structural unit (a6)"). The structural unit (a6) is effective in improving the adhesion of the resist film to the support (such as a substrate), and in enhancing the hydrophilicity of the resin relative to a developing solution. Furthermore, the structural unit (a6) also enables the formation of a coating film that exhibits superior adhesion to a resist pattern.

In the structural unit (a6), a lower alkyl group or a hydrogen atom is preferably bonded to the α-position carbon atom. The lower alkyl group bonded to the α-position carbon atom is the same as that described above for the lower alkyl group of the structural unit (a5), and is preferably a methyl group.

Examples of the structural unit (a6) include structural units in which a monocyclic group formed from a lactone ring or a polycyclic cyclic group that includes a lactone ring is bonded to the ester side-chain portion of an acrylate ester.

The term "lactone ring" refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Examples of the structural unit (a6) include units that contain a monocyclic group in which one hydrogen atom has been removed from γ-butyrolactone, and units that contain a polycyclic group in which one hydrogen atom has been removed from a lactone ring-containing bicycloalkane.

Specifically, the structural unit (a6) is preferably at least one unit selected from general formulas (IV') through (VII') shown below.

[Chemical Formula 11]

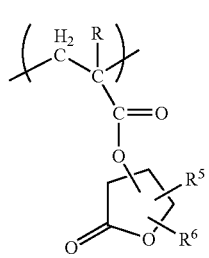

(IV')

wherein R is as defined above, and $R^5$ and $R^6$ each independently represents a hydrogen atom or a lower alkyl group.

[Chemical Formula 12]

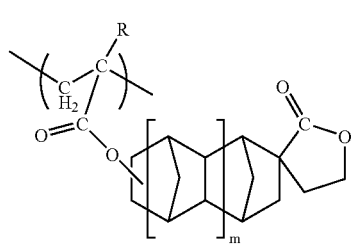

(V')

wherein R is as defined above, and m represents either 0 or 1.

[Chemical Formula 13]

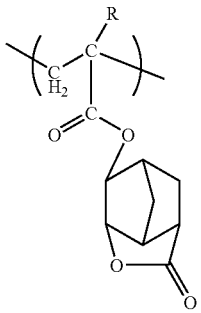

(VI')

wherein R is as defined above.

[Chemical Formula 14]

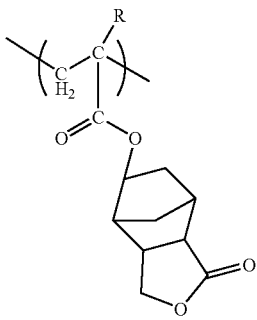

(VII')

wherein R is as defined above.

In general formula (IV'), $R^5$ and $R^6$ each independently represents a hydrogen atom or a lower alkyl group, and preferably represents a hydrogen atom. The lower alkyl group for the groups $R^5$ and $R^6$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, amongst the structural units represented by general formulas (IV') to (VII'), structural units represented by general formula (IV') are low cost and therefore preferred industrially, and of the possible structural units represented by formula (IV'), α-methacryloyloxy-γ-butyrolactone, in which R is a methyl group, $R^5$ and $R^6$ are both hydrogen atoms, and the position of the ester linkage between the methacrylate ester and the γ-butyrolactone is at the α-position on the lactone ring, is the most desirable.

The structural unit (a6) may be used as either a single structural unit, or a combination of two or more different structural units.

The proportion of the structural unit (a6) within the component (A-12), relative to the combined total of all the structural units that constitute the component (A-12), is preferably within a range from 20 to 60 mol %, more preferably from 20 to 55 mol %, and is most preferably from 30 to 50 mol %.

Ensuring that this proportion is at least as large as the lower limit of the above-mentioned range improves the lithography properties, whereas ensuring that the proportion is not greater than the upper limit of the above-mentioned range enables a favorable balance to be achieved with the other structural units.

The component (A-12) preferably also includes, either in addition to the structural unit (a5) described above, or in addition to the structural units (a5) and (a6), a structural unit derived from an acrylate ester that contains a polar group-containing aliphatic hydrocarbon group (hereafter abbreviated as "structural unit (a7)").

Including the structural unit (a7) increases the hydrophilicity of the entire component (A-12), thereby improving the affinity with a developing solution, improving the alkali solubility within the exposed portions of the resist, and contributing to an improvement in the resolution. Furthermore, the structural unit (a7) also enables the formation of a coating film that exhibits superior adhesion to the resist pattern.

In the structural unit (a7), a lower alkyl group or a hydrogen atom is preferably bonded to the α-position carbon atom. The lower alkyl group bonded to the α-position carbon atom is the same as that described above for the lower alkyl group of the structural unit (a5), and is preferably a methyl group.

Examples of the polar group include a hydroxyl group, cyano group, carboxyl group, or amino group or the like, although a hydroxyl group is particularly preferred.

Examples of the polycyclic group include polycyclic groups selected from amongst the aliphatic cyclic groups exemplified above in relation to the "acid-dissociable, dissolution-inhibiting group that contains an aliphatic cyclic group" within the aforementioned structural unit (a5).

The structural unit (a7) is preferably at least one unit selected from general formulas (VIII') and (IX') shown below.

[Chemical Formula 15]

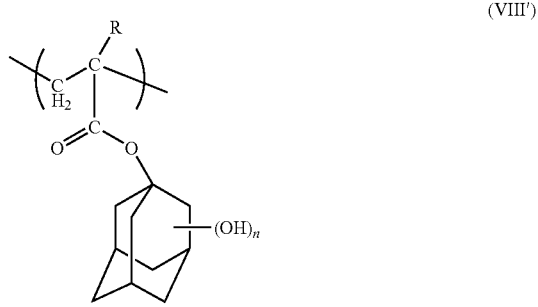

(VIII')

wherein R is as defined above, and n represents an integer of 1 to 3.

In general formula (VIII'), R is as described above for R in general formulas (I') to (III').

In general formula (VIII'), structural units in which n is 1, and the hydroxyl group is bonded to position 3 of the adamantyl group are preferred.

[Chemical Formula 16]

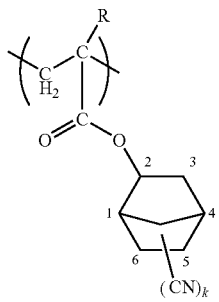

(IX')

wherein R is as defined above, and k represents an integer of 1 to 3.

In general formula (IX'), structural units in which k is 1 are preferred. Furthermore, the cyano group is preferably bonded to position 5 or position 6 of the norbornyl group.

The structural unit (a7) may be used as either a single structural unit, or a combination of two or more different structural units.

The proportion of the structural unit (a7) within the component (A-12), relative to the combined total of all the structural units that constitute the component (A-12), is preferably within a range from 10 to 50 mol %, more preferably from 15 to 40 mol %, and is most preferably from 20 to 35 mol %. Ensuring that this proportion is at least as large as the lower limit of the above-mentioned range improves the lithography properties, whereas ensuring that the proportion is not greater than the upper limit of the above-mentioned range enables a favorable balance to be achieved with the other structural units.

In the component (A-12), the combined total of these structural units (a5) through (a7), relative to the combined total of all the structural units that constitute the component (A-12), is preferably within a range from 70 to 100 mol %, and is more preferably from 80 to 100 mol %.

The component (A-12) may also include a structural unit (a8) besides the aforementioned structural units (a5) through (a7).

There are no particular restrictions on the structural unit (a8), which may be any other structural unit that cannot be classified as one of the above structural units (a5) through (a7).

For example, structural units that contain a polycyclic aliphatic hydrocarbon group and are derived from an acrylate ester (and particularly from an (α-lower alkyl)acrylate ester) are preferred. Suitable examples of the polycyclic aliphatic hydrocarbon group include polycyclic groups selected from amongst the aliphatic cyclic groups exemplified above in relation to the "acid-dissociable, dissolution-inhibiting group that contains an aliphatic cyclic group". In terms of factors such as industrial availability, at least one group selected from amongst a tricyclodecanyl group, adamantyl group, tetracyclododecanyl group, norbornyl group and isobornyl group is particularly preferred. The structural unit (a8) is most preferably a non-acid-dissociable group.

Specific examples of the structural unit (a8) include units having structures represented by general formulas (X) to (XII) shown below.

[Chemical Formula 17]

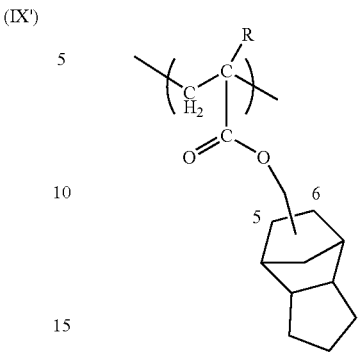

(X)

wherein R is as defined above.

[Chemical Formula 18]

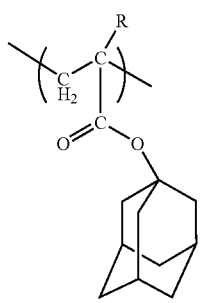

(XI)

wherein R is as defined above.

[Chemical Formula 19]

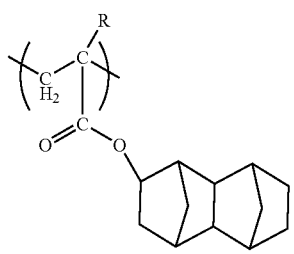

(XII)

wherein R is as defined above.

In those cases where a structural unit (a8) is included, the proportion of the structural unit (a8) within the component (A-12), relative to the combined total of all the structural units that constitute the component (A-12), is preferably within a range from 1 to 25 mol %, and is more preferably from 5 to 20 mol %.

The component (A-12) is preferably a copolymer that includes at least the structural units (a5), (a6), and (a7). Examples of such copolymers include copolymers formed solely from the aforementioned structural units (a5), (a6) and (a7), and copolymers formed from the structural units (a5), (a6), (a7) and (a8).

In the present invention, as these copolymers, copolymers containing a combination of structural units such as those shown below are particularly preferred.

[Chemical Formula 20]

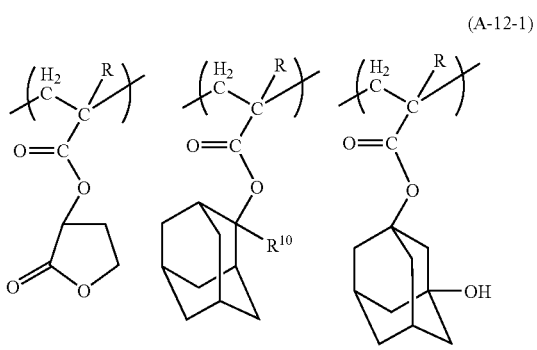

(A-12-1)

wherein R is as defined above, and $R^{10}$ represents a lower alkyl group.

[Chemical Formula 21]

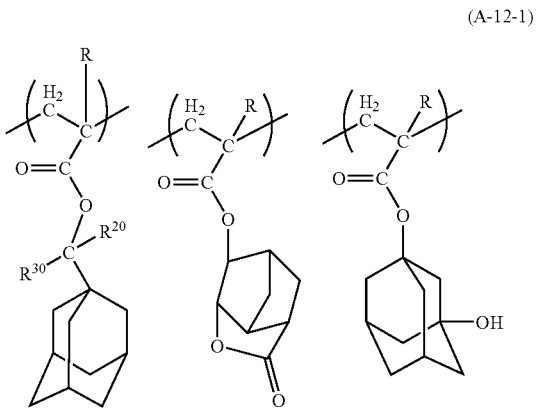

(A-12-1)

wherein R is as defined above, and $R^{20}$ and $R^{30}$ each independently represents a lower alkyl group.

In formula (A-12-1), the lower alkyl group for $R^{10}$ is as defined for the lower alkyl group for R, is preferably a methyl group or an ethyl group, and is most preferably a methyl group.

In formula (A-12-2), the lower alkyl groups for $R^{20}$ and $R^{30}$ are as defined for the lower alkyl group for R, are each preferably a methyl group or an ethyl group, and more preferably a methyl group. Copolymers in which $R^{20}$ and $R^{30}$ are both methyl groups are the most desirable.

Hereafter, a copolymer represented by formula (A-12-1) is referred to as "resin (A-12-1)", and a copolymer represented by formula (A-12-2) is referred to as "resin (A-12-2)".

Within the component (A'), either a single type of component (A-1) may be used alone, or a combination of two or more types may be used.

In those cases where two or more types of the component (A-1) are used in combination, then in terms of improving the lithography properties, combining the resin (A-12-1) and the resin (A-12-2) is particularly desirable.

There are no particular limitations on the blend ratio (weight ratio) between the resin (A-12-1) and the resin (A-12-2), but in terms of achieving the effect described above, the ratio of resin (A-12-1):resin (A-12-2) is preferably within a range from 9:1 to 1:9, more preferably from 8:2 to 2:8, and most preferably from 7:3 to 3:7. Provided the blend ratio is within this range, the lithography properties can be further improved.

The component (A-1) can be obtained by polymerizing the monomers corresponding with each of the structural units using a conventional method. For example, the component (A-1) can be obtained by a conventional radical polymerization or the like of the monomers corresponding with each of the structural units, using a radical polymerization initiator such as azobisisobutyronitrile (AIBN).

Further, the component (A') can be obtained, for example, by mixing resin components such as the component (A-1) obtained via the method described above.

The weight average molecular weight (Mw, the polystyrene equivalent weight average molecular weight determined by gel permeation chromatography, this also applies below) of the component (A-1) is preferably not more than 30,000, more preferably not more than 20,000, and still more preferably 12,000 or lower. The lower limit for this range is typically greater than 2,000, although from the viewpoints of inhibiting pattern collapse and achieving a favorable improvement in resolution and the like, the weight average molecular weight is preferably at least 4,000, and more preferably 5,000 or greater.

Furthermore, although there are no particular limitations on the dispersity (Mw/Mn), the dispersity is preferably within a range from 1.0 to 5.0, more preferably from 1.0 to 3.0, and most preferably from 1.2 to 2.5. Mn represents the number average molecular weight.

Component (A-2)

As the component (A-2), low molecular weight compounds having a molecular weight of at least 500 but not more than 2,000, containing a hydrophilic group, and also containing an acid-dissociable, dissolution-inhibiting group such as the group X or X' described above in relation to the component (A-1) are preferred. Specific examples include compounds containing a plurality of phenol structures in which a portion of the hydroxyl group hydrogen atoms have been substituted with the acid-dissociable, dissolution-inhibiting groups X or X'.

Preferred examples of the component (A-2) include low molecular weight phenol compounds in which a portion of the hydroxyl group hydrogen atoms have been substituted with the aforementioned acid-dissociable, dissolution-inhibiting groups. These types of compounds are known, for example, as sensitizers or heat resistance improvers for use in non-chemically amplified g-line or i-line resists, and any of these compounds may be used.

Examples of these low molecular weight phenol compounds include the compounds listed below.

Examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and two, three or four benzene ring type compounds of formalin condensation products of phenols such as phenol, m-cresol, p-cresol and xylenol. Of course this is not a restrictive list.

Similarly, there are no particular restrictions on the acid-dissociable, dissolution-inhibiting group, and suitable examples include the groups described above.

[Component (B)]

As the component (B) within the first resist composition, known materials used as acid generators in conventional chemically amplified resists can be used.

Examples of these types of acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

Specific examples of the onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl) sulfonium trifluoromethanesulfonate, heptafluoropropanesulfonate or nonafluorobutanesulfonate, and di(1-naphthyl)phenylsulfonium trifluoromethanesulfonate, heptafluoropropanesulfonate or nonafluorobutanesulfonate. Further, it is also possible to use onium salts in which the anion moiety of these onium salts is replaced by methanesulfonate, n-propanesulfonate, n-butanesulfonate, or n-octanesulfonate.

Further, onium salt-based acid generators in which the anion moiety from one of the specific onium salt-based acid generators listed above is replaced by an anion moiety represented by general formula (b-3) or (b-4) shown below (and in which the cation moiety is the same as the specific onium salt-based acid generator listed above) may also be used.

[Chemical Formula 22]

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group has 1 to 10 carbon atoms, preferably 1 to 7 carbon atoms, and most preferably 1 to 3 carbon atoms.

Within the above-mentioned ranges for the number of carbon atoms in the alkylene group for X" or the alkyl group for Y" and Z", smaller numbers are preferred as they result in more favorable solubility within the resist solvent.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or an electron beam is improved. The proportion of fluorine atoms within the alkylene group or alkyl group, namely the fluorination ratio, is preferably from 70 to 100% and more preferably from 90 to 100%, and it is particularly desirable that the alkylene group or alkyl group is a perfluoroalkylene or perfluoroalkyl group in which all the hydrogen atoms are substituted with fluorine atoms.

Specific examples of suitable oxime sulfonate compounds include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Specific examples of diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

As the component (B), either one type of acid generator may be used alone, or a combination of two or more types may be used.

In the present invention, as the component (B), the use of an onium salt in which the anion is either a fluorinated alkylsulfonate ion or an anion moiety represented by general formula (b-3) is preferred.

The quantity used of the component (B) is typically within a range from 1 to 20 parts by weight, and preferably from 2 to 10 parts by weight, per 100 parts by weight of the component (A). Ensuring that the quantity is at least as large as the lower limit of the above-mentioned range enables favorable pattern formation, whereas ensuring that the quantity is not greater than the upper limit of the above-mentioned range facilitates the production of a uniform solution, and enables favorable storage stability to be achieved.

[Optional Components]

In order to improve the pattern shape and the post exposure stability of the latent image formed by the pattern-wise exposure of the resist layer, the first resist composition preferably also includes a nitrogen-containing organic compound (D) (hereafter also referred to as "component (D)") as an optional component.

A multitude of these components (D) have already been proposed, and any of these known compounds may be used, although an amine, and in particular a secondary lower aliphatic amine or tertiary lower aliphatic amine, is preferred.

Here, a lower aliphatic amine refers to an alkyl or alkyl alcohol amine of not more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and tertiary alkanolamines such as triethanolamine and triisopropanolamine are particularly preferred.

These compounds may be used either alone, or in combinations of two or more different compounds.

The component (D) is typically added in a quantity within a range from 0.01 to 5.0 parts by weight per 100 parts by weight of the component (A).

Furthermore, in the first resist composition, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter also referred to as "component (E)") may also be added as another optional component. The component (D) and the component (E) can be used in combination, or either one can also be used alone.

As the organic carboxylic acid, compounds such as malonic acid, citric acid, malic acid, succinic acid, benzoic acid and salicylic acid are preferred.

Examples of the phosphorus oxo acid or derivative thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is typically used in a quantity within a range from 0.01 to 5.0 parts by weight per 100 parts by weight of the component (A).

Other miscible additives can also be added to the first resist composition according to need, including additive resins for improving the properties of the applied film of the resist composition, surfactants for improving the coating properties, dissolution inhibitors, plasticizers, stabilizers, colorants and halation prevention agents.

The first resist composition can be prepared by dissolving the materials for the resist composition in an organic solvent (S).

The component (S) may be any solvent capable of dissolving the various components used to generate a uniform solution, and one or more solvents selected from known materials used as the solvents for conventional resist compositions can be used.

Specific examples of the solvent include lactones such as γ-butyrolactone; ketones such as acetone, methyl ethyl ketone, cyclohexanone, methyl n-amyl ketone (MAK), methyl isoamyl ketone and 2-heptanone; monohydric or polyhydric alcohols such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and dipropylene glycol monoacetate; polyhydric alcohol derivatives such as the monomethyl ethers, monoethyl ethers, monopropyl ethers, monobutyl ethers or monophenyl ethers of the above alcohols; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, and propylene glycol monomethyl ether (PGME) are preferred.

These organic solvents may be used either alone, or as a mixed solvent of two or more different solvents.

In the case of a mixed solvent of two or more solvents, a mixed solvent containing PGMEA is preferred. Specifically, a mixed solvent of PGMEA and MAK is preferable. In this case, the mixing ratio between the two solvents, reported as a weight ratio PGMEA:MAK, is preferably within a range from 1:9 to 9:1, more preferably from 2:8 to 8:2, and still more preferably from 3:7 to 7:3.

There are no particular restrictions on the quantity used of the component (S), and a quantity that produces a solution having a concentration that enables the first resist composition to be applied satisfactorily to a support is used.

<Second Resist Composition>

In the method of forming a resist pattern according to the present invention, a negative resist composition containing an ether-based organic solvent (S") having no hydroxyl groups is used as the second resist composition.

This second resist composition (negative resist composition) is preferably a chemically amplified resist composition.

In the present invention, the negative resist composition is preferably obtained by dissolving an alkali-soluble resin component (A") (hereafter frequently referred to as "component (A")"), an acid generator component (B) that generates acid upon exposure, and a cross-linker component (C) (hereafter frequently referred to as "component (C)") in the aforementioned ether-based organic solvent (S").

In this negative resist composition, when acid is generated from the component (B) upon exposure, the action of the acid causes cross-linking between the component (A") and the component (C), causing the component (A") to change from an alkali-soluble state to an alkali-insoluble state. Therefore, in the formation of a resist pattern, by conducting selective exposure of a resist film formed by applying the negative resist composition to a support such as a substrate, the exposed portions become alkali-insoluble, whereas the unexposed portions remain alkali-soluble, meaning alkali developing can then be conducted.

In the negative resist composition, the component (A") is preferably an alkali-soluble resin having a fluorinated hydroxyalkyl group such as that represented by general formula (a1-1-1) shown below.

Specific examples of preferred forms of the component (A") include components that include a resin (A1), which contains a structural unit (a1") containing, within the main chain, an aliphatic cyclic group having a fluorinated hydroxyalkyl group, and preferably also contains a structural unit (a2") having a hydroxyalkyl group.

Further, another preferred form of the component (A") includes a resin (A2), which contains a structural unit containing an aliphatic cyclic group having a fluorinated hydroxyalkyl group, and preferably also contains a structural unit derived from an acrylate ester containing a hydroxyl group-containing aliphatic cyclic group, and/or a structural unit derived from an acrylic acid that has no cyclic structure and has an alcoholic hydroxyl group on a side chain.

(Resin (A1))

In the present invention, the resin (A1) includes a structural unit (a1") containing, within the main chain, an aliphatic cyclic group having a fluorinated hydroxyalkyl group (hereafter abbreviated as "structural unit (a1")").

Further, the resin (A1) preferably also includes, in addition to the structural unit (a1"), a structural unit (a2") having a hydroxyalkyl group (hereafter abbreviated as "structural unit (a2")").

Structural Unit (a1")

The resin (A1) includes a structural unit (a1") containing, within the main chain, an aliphatic cyclic group having a fluorinated hydroxyalkyl group.

In the structural unit (a1"), the "aliphatic cyclic group having a fluorinated hydroxyalkyl group" refers to a group in which a fluorinated hydroxyalkyl group is bonded to a carbon atom that constitutes part of a ring of an aliphatic cyclic group.

Furthermore, the description of the aliphatic cyclic group as being "within the main chain" means that at least one, and preferably two or more carbon atoms within the ring structure of the aliphatic cyclic group constitute part of the main chain of the resin (A1).

In the present invention, by using a component (A") that includes the resin (A1) containing the structural unit (a1"), the solubility of the resist film within an alkali developing solution is enhanced, and lithography properties such as the resist pattern shape and the line width roughness (LWR) are also improved. Further, because the resin (A1) includes the aliphatic cyclic group (such as a norbornane or tetracyclododecane structure) within the main chain, the carbon density is increased, yielding an improvement in the etching resistance.

Here, a "fluorinated hydroxyalkyl group" refers to a hydroxyalkyl group, in which a portion of the hydrogen atoms of an alkyl group have been substituted with hydroxyl groups, wherein some or all of the remaining hydrogen atoms within the hydroxyalkyl group have been substituted with fluorine atoms.

In a fluorinated hydroxyalkyl group, the fluorination increases the ease with which the hydrogen atom of the hydroxyl group is released.

In the fluorinated hydroxyalkyl group, the alkyl group is preferably a linear or branched alkyl group.

Although there are no particular limitations on the number of carbon atoms within the alkyl group, the number of carbon atoms is preferably within a range from 1 to 20, more preferably from 4 to 16, and most preferably from 4 to 12.

There are no particular limitations on the number of hydroxyl groups, although a single hydroxyl group is preferred.

As the fluorinated hydroxyalkyl group, of the various possibilities, groups in which a fluorinated alkyl group and/or a fluorine atom is bonded to the carbon atom to which the hydroxyl group is bonded (namely, the α-position carbon atom of the hydroxyalkyl group) are preferred.

Furthermore, the fluorinated alkyl group bonded to the α-position is preferably a group in which all of the hydrogen atoms of the alkyl group have been substituted with fluorine atoms. Furthermore, as the alkyl group of this fluorinated alkyl group, a linear or branched alkyl group of 1 to 5 carbon atoms is preferred, and an alkyl group of one carbon atom is the most desirable.

The term "aliphatic" in the expression "aliphatic cyclic group having a fluorinated hydroxyalkyl group" is a relative concept used in relation to the term "aromatic", and defines a group or compound or the like that contains no aromaticity. The aliphatic cyclic group may be either monocyclic or polycyclic.

The expression "monocyclic aliphatic cyclic group" describes a monocyclic group that contains no aromaticity, whereas the expression "polycyclic aliphatic cyclic group" describes a polycyclic group that contains no aromaticity.

In the structural unit (a1"), the aliphatic cyclic group is preferably a polycyclic group, as such groups provide superior etching resistance and the like.

The aliphatic cyclic group includes both hydrocarbon groups formed solely from carbon and hydrogen (alicyclic groups), and heterocyclic groups in which some of the carbon atoms that constitute the ring structure of an alicyclic group have been substituted with hetero atoms such as an oxygen atom, nitrogen atom, or sulfur atom. These aliphatic cyclic groups may include substituents, and examples of these substituents include alkyl groups of 1 to 5 carbon atoms.

The expression "include substituents" means that some or all of the hydrogen atoms bonded to the carbon atoms that constitute the ring structure of the aliphatic cyclic group have been substituted with substituents (atoms other than a hydrogen atom, or groups). In the present invention, an alicyclic group is preferred as the aliphatic cyclic group.

The aliphatic cyclic group may be either saturated or unsaturated, although a saturated group is preferred, as such groups exhibit superior transparency to ArF excimer lasers and the like, and also exhibit excellent resolution and depth of focus (DOF) and the like.

The number of carbon atoms within the aliphatic cyclic group is preferably within a range from 5 to 15.

Specific examples of the aliphatic cyclic group include the groups described below.

Examples of the monocyclic groups include groups in which two or more hydrogen atoms have been removed from a cycloalkane. Specific examples include groups in which two or more hydrogen atoms have been removed from cyclopentane or cyclohexane, and groups in which two or more hydrogen atom have been removed from cyclohexane are preferred.

Examples of the polycyclic groups include groups in which two or more hydrogen atoms have been removed from a bicycloalkane, a tricycloalkane or a tetracycloalkane or the like. Specific examples include groups in which two or more hydrogen atoms have been removed from a polycycloalkane such as adamantane, norbornane, isobornane, tricyclodecane or tetracyclododecane.

These types of aliphatic cyclic groups can be selected appropriately from the multitude of groups that have been proposed for the resins of photoresist compositions used in ArF excimer laser processes.

Of the various possibilities, groups in which two or more hydrogen atoms have been removed from cyclohexane, adamantane, norbornane or tetracyclododecane are readily available industrially, and are consequently preferred.

Of the alicyclic groups exemplified above, groups such as those shown in a structural unit (a1-1) below, in which three hydrogen atoms have been removed from norbornane or tetracyclododecane, are preferred, and groups in which three hydrogen atoms have been removed from norbornane are particularly desirable.

Of the units included within the definition of the structural unit (a1"), structural units (a1-1) represented by general formula (a1-1) shown below are preferred. By including the structural unit (a1-1), the solubility of the resin in an alkali developing solution improves significantly. Furthermore, the lithography properties such as the resolution are also improved.

[Chemical Formula 23]

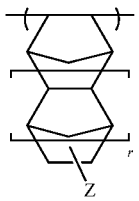

(a1-1)

wherein Z represents a fluorinated hydroxyalkyl group, and r is either 0 or 1.

In formula (a1-1), r is either 0 or 1, and in terms of industrial availability, is preferably 0.

Further, in formula (a1-1), examples of the "fluorinated hydroxyalkyl group" represented by Z include the same groups as those exemplified above. Of these, Z is preferably a group represented by general formula (a1-1-1) shown below, as such groups yield a particularly superior resist pattern shape as well as reduced levels of line edge roughness (LER) and the like.

"Line edge roughness (LER)" refers to non-uniform unevenness in the side walls of pattern lines.

[Chemical Formula 24]

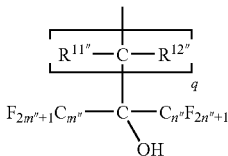

(a1-1-1)

wherein $R^{11''}$ and $R^{12''}$ each independently represents a hydrogen atom or a lower alkyl group, m" and n" each independently represents an integer of 1 to 5, and q also represents an integer of 1 to 5.

In formula (a1-1-1), $R^{11''}$ and $R^{12''}$ each independently represents a hydrogen atom or a lower alkyl group.

As the lower alkyl group, a linear or branched lower alkyl group of not more than carbon atoms is preferred, and specific examples thereof include a methyl group, ethyl group, propyl group, isopropyl group, n-butyl group, isobutyl group, tert-butyl group, pentyl group, isopentyl group or neopentyl group, and a methyl group is particularly desirable.

Of the various possibilities, groups in which $R^{11''}$ and $R^{12''}$ are both hydrogen atoms are particularly desirable.

q represents an integer of 1 to 5, and preferably an integer of 1 to 3, and is most preferably 1.

m" and n" each independently represents an integer of 1 to 5, and preferably an integer of 1 to 3. Groups in which m" and n" are both 1 are preferred in terms of ease of synthesis.

The structural unit (a1") may use either one type of structural unit, or a mixture of two or more types.

The proportion of the structural unit (a1") within the resin (A1), relative to the combined total of all the structural units that constitute the resin (A1), is preferably within a range from 50 to 90 mol %, more preferably from 55 to 90 mol %, and still more preferably from 60 to 80 mol %. Making this proportion at least as large as the lower limit of the above-mentioned range yields an improvement in the effects achieved by including the structural unit (a1"), whereas by ensuring that the proportion is not more than the upper limit of the above-mentioned range, a favorable balance can be achieved with the other structural units.

Structural Unit (a2")

In addition to the structural unit (a1"), the resin (A1) preferably also includes a structural unit (a2") having a hydroxyalkyl group.

In the present invention, including a resin (A1) containing the structural unit (a2") within the component (A") improves the solubility of the component (A") within an alkali developing solution. Further, the cross-linking of the component (A") with the component (C) is enhanced, meaning the difference in the solubility within the alkali developing solution (the contrast) between the exposed portions and the unexposed portions can be increased, enabling the composition to function more effectively as a negative resist.

As the structural unit (a2"), units such as a structural unit (a210) that contains, within the main chain, an aliphatic cyclic group having a hydroxyalkyl group (hereafter abbreviated as "structural unit (a210)"), and a structural unit (a220) derived from an acrylate ester having a hydroxyl group-containing alkyl group (hereafter abbreviated as "structural unit (a220)") are preferred.

The structural unit (a2") may use either one type of structural unit, or a mixture of two or more types.

Structural Unit (a210)

In the present invention, the structural unit (a210) is a structural unit that contains, within the main chain, an aliphatic cyclic group having a hydroxyalkyl group.

Examples of the structural unit (a210) include the same units as those exemplified above for the structural unit (a1"), with the exception that the "fluorinated hydroxyalkyl group" within the structural unit (a1") is replaced with an unfluorinated hydroxyalkyl group, namely a hydroxyalkyl group in which a portion of the hydrogen atoms of an alkyl group have been substituted with hydroxyl groups, and the remaining hydrogen atoms have not been substituted with fluorine atoms.

Of the units included within this definition of the structural unit (a210), structural units (a2-1) represented by general formula (a2-1) shown below are preferred. By including the structural unit (a2-1), lithography properties such as the resist pattern shape and the line width roughness (LWR) are improved. Further, a favorable contrast is more readily obtained, and the etching resistance also improves.

[Chemical Formula 25]

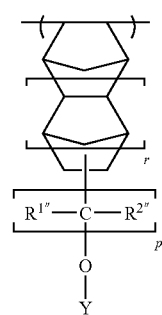

(a2-1)

wherein $R^{1''}$ and $R^{2''}$ each independently represents a hydrogen atom or a lower alkyl group, Y represents a hydrogen atom or a hydroxyalkyl group, r represents either 0 or 1, and p represents an integer of 1 to 3.

The structural unit (a2-1) represented by general formula (a2-1) is a structural unit containing, within the main chain, a norbornane or tetracyclododecane structure having a hydroxyalkyl group.

In formula (a2-1), $R^{1\prime\prime}$ and $R^{2\prime\prime}$ each independently represents a hydrogen atom or a lower alkyl group. Examples of the lower alkyl group include the same groups as those exemplified above for the lower alkyl groups represented by $R^{11\prime\prime}$ and $R^{12\prime\prime}$ in formula (a1-1-1). Of the various possibilities, groups in which $R^{1\prime\prime}$ and $R^{2\prime\prime}$ are both hydrogen atoms are particularly desirable.

Y represents a hydrogen atom or a hydroxyalkyl group.

As the hydroxyalkyl group, a linear or branched hydroxyalkyl group of 1 to 10 carbon atoms is preferred, a linear or branched hydroxyalkyl group of 1 to 8 carbon atoms is more preferred, and a linear lower hydroxyalkyl group of 1 to 3 carbon atoms is still more preferred.

There are no particular limitations on the number of hydroxyl groups or the bonding positions of those hydroxyl groups within the hydroxyalkyl group, although a single hydroxyl group is typical, and this hydroxyl group is preferably bonded to the alkyl group terminal.

Y is most preferably a hydrogen atom.

r is either 0 or 1, and is preferably 0.

p represents an integer of 1 to 3, is preferably 1 or 2, and is most preferably 1.

Specific examples of the structural unit (a2-1) include units represented by chemical formulas (a2-1-1) to (a2-1-7) shown below.

[Chemical Formula 26]

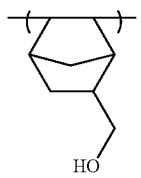
(a2-1-1)

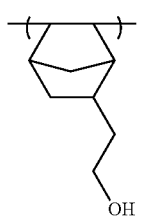
(a2-1-2)

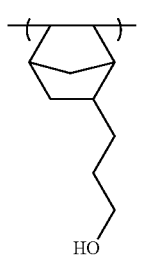
(a2-1-3)

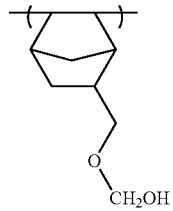
(a2-1-4)

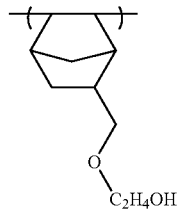
(a2-1-5)

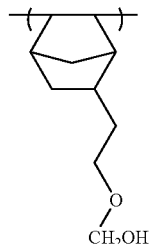
(a2-1-6)

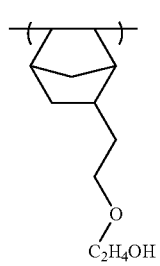
(a2-1-7)

Of these structural units, those represented by the above-mentioned chemical formulas (a2-1-1), (a2-1-2) and (a2-1-3) are preferred.

The structural unit (a210) may use either one type of structural unit, or a mixture of two or more types.

The proportion of the structural unit (a210) within the resin (A1), relative to the combined total of all the structural units that constitute the resin (A1), is preferably within a range from 10 to 50 mol %, more preferably from 15 to 50 mol %, and still more preferably from 20 to 45 mol %. Making this proportion at least as large as the lower limit of the above-mentioned range improves the effects achieved by including the structural unit (a2″) such as improving the alkali solubility and making a favorable contrast more readily obtainable. In contrast, by ensuring that the proportion is not more than the upper limit of the above-mentioned range, a favorable balance can be achieved with the other structural units.

Structural Unit (a220)

The structural unit (a220) is a structural unit derived from an acrylate ester having a hydroxyl group-containing alkyl group.

If the structural unit (a220) is a structural unit that includes a hydroxyl group-containing cyclic alkyl group (hereafter abbreviated as "structural unit (a221)"), then the resist pattern swelling suppression effect is further enhanced. Further, the resolution is also improved. Furthermore, favorable levels of contrast and etching resistance are also more readily obtained.

Examples of the structural unit (a221) include those units, amongst the structural units exemplified below in the description of a "structural unit (a22) derived from an acrylate ester containing a hydroxyl group-containing aliphatic cyclic group" that constitutes a resin (A2) described below, in which the aliphatic cyclic group is a saturated hydrocarbon group. Of these structural units, units in which the substituent bonded to the α-position of the acrylate ester is a fluorine atom or a fluorinated alkyl group are preferred, and this substituent is more preferably a fluorinated alkyl group, and most preferably a trifluoromethyl group (—CF$_3$).

Furthermore, if the structural unit (a220) is a structural unit that includes a hydroxyl group-containing chain-like alkyl group (hereafter abbreviated as "structural unit (a222)"), then the hydrophilicity of the entire component (A") is increased, the solubility of the component within an alkali developing solution is improved, and the resolution also improves. Further, the controllability of the cross-linking reaction that occurs during resist pattern formation improves, yielding improvements in the pattern shape and the resolution. Moreover, the film density also tends to increase, and this enables suppression of thickness loss during etching, and tends to also improve the heat resistance.

Examples of the structural unit (a222) include those units, amongst the structural units exemplified below in the description of a "structural unit (a23) derived from an acrylic acid that has no cyclic structure and has an alcoholic hydroxyl group on a side chain" that constitutes the resin (A2) described below, that include a hydroxyalkyl group. Of these structural units, units having a hydroxyalkyl group at the ester portion of the acrylate ester are preferred, structural units in which the substituent bonded to the α-position of the acrylate ester is a fluorine atom or a fluorinated alkyl group are more preferred, and this substituent is still more preferably a fluorinated alkyl group, and most preferably a trifluoromethyl group (—CF$_3$).

The structural unit (a220) may use either one type of structural unit, or a mixture of two or more types.

The proportion of the structural unit (a220) within the resin (A1), relative to the combined total of all the structural units that constitute the resin (A1), is preferably within a range from 10 to 80 mol %, more preferably from 15 to 60 mol %, and still more preferably from 20 to 55 mol %. Making this proportion at least as large as the lower limit of the above-mentioned range ensures that the effects obtained by including the structural unit (a220) are achieved, whereas by ensuring that the proportion is not more than the upper limit of the above-mentioned range, a favorable balance can be achieved with the other structural units.

In those cases where the structural unit (a220) includes both the structural unit (a221) and the structural unit (a222), the mixing ratio between the two structural units, reported as a molar ratio, is preferably such that the ratio of structural unit (a221):structural unit (a222) is from 9:1 to 1:9, more preferably from 8:2 to 2:8, and most preferably from 6:4 to 7:3.

By including the structural unit (a221) and the structural unit (a222) in a favorable balance that satisfies the above-mentioned mixing ratio, a favorable exposure margin can be obtained. Further, a suitable level of contrast is obtained, and the resolution is improved. Moreover, the etching resistance also improves.

Other Structural Units

In the negative resist composition of the present invention, besides the structural units (a1") and (a2") described above, the component (A") may also include other structural units typically used in the component (A") of conventional chemically amplified resist compositions.

However, in the present invention, the resin (A1) is preferably a resin in which the structural units (a1") and (a2") represent the main components.

Here the term "main components" means that the combined quantity of the structural unit (a1") and the structural unit (a2") preferably represents at least 70 mol %, and more preferably 80 mol % or more of the resin (A1). Of the various possibilities, resins in which the combination of the structural units (a1") and (a2") represents 100 mol % of the resin are the most desirable.

In the present invention, the combination of the structural unit (a1") and the structural unit (a2") within the resin (A1) is preferably a combination of the structural unit (a1") and the structural unit (a210). Examples of this combination include the combinations of structural units represented by chemical formulas (A1-1) to (A1-4) shown below.

[Chemical Formula 27]

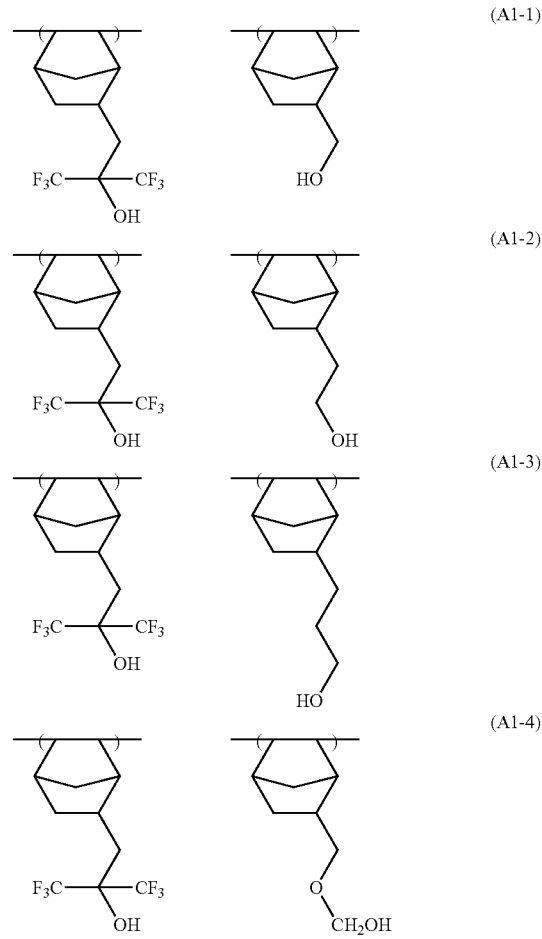

In the present invention, the weight average molecular weight (Mw, the polystyrene equivalent molecular weight measured by gel permeation chromatography) of the resin (A1) is preferably within a range from 2,000 to 10,000, more preferably from 3,000 to 6,000, and most preferably from 3,000 to 5,000. Ensuring that this molecular weight is at least as large as the lower limit of the above-mentioned range enables good contrast to be obtained, whereas ensuring the molecular weight is not more than the upper limit of the above-mentioned range can suppress swelling of the resist pattern. As a result, the resolution can be improved. Further, suppressing swelling of the pattern also yields an improvement in the depth of focus (DOF) properties and improved suppression of line edge roughness (LER). Furthermore, ensuring a weight average molecular weight within the above range is preferred in terms of achieving a large suppression effect on resist pattern swelling. Lower weight average molecular weights within the above-mentioned range tend to yield more favorable properties.

Further, the dispersity (Mw/Mn) is preferably within a range from 1.0 to 5.0, and is more preferably from 1.0 to 2.5.

When the resin (A1) is used in the component (A"), one type of the resin (A1) may be used alone, or a mixture of two or more types may be used.

In those cases where the resin (A1) is used, the proportion of the resin (A1) within the component (A") is preferably at least 70 mol %, more preferably 80 mol % or greater, and is most preferably 100 mol %.

(Resin (A2))

In the present invention, the resin (A2) includes a structural unit containing an aliphatic cyclic group having a fluorinated hydroxyalkyl group (hereafter abbreviated as "structural unit (a21)").

Further, in addition to the structural unit (a21), the resin (A2) preferably also includes a structural unit derived from an acrylate ester containing a hydroxyl group-containing aliphatic cyclic group (hereafter abbreviated as "structural unit (a22)").

Furthermore, in addition to the structural unit (a21), or in addition to a combination of the structural unit (a21) and the structural unit (a22), the resin (A2) preferably also includes a structural unit derived from an acrylic acid that has no cyclic structure and has an alcoholic hydroxyl group on a side chain (hereafter abbreviated as "structural unit (a23)").

Structural Unit (a21)

The structural unit (a21) is a structural unit that includes an aliphatic cyclic group having a fluorinated hydroxyalkyl group. Including the structural unit (a21) improves the solubility in an alkali developing solution. Further, swelling of the resist is suppressed, and lithography properties such as the pattern shape and LWR are improved.

The aliphatic cyclic group having a fluorinated hydroxyalkyl group is the same as that described above for the structural unit (a1"), and as the aliphatic cyclic group (prior to the bonding of the fluorinated hydroxyalkyl group), groups in which two hydrogen atoms have been removed from cyclohexane, adamantane, norbornane or tetracyclododecane are readily available industrially, and are consequently preferred.

Of these monocyclic and polycyclic groups, a group in which two hydrogen atoms have been removed from norbornane is particularly desirable.

The structural unit (a21) is preferably a structural unit derived from acrylic acid. A structure in which the above-mentioned aliphatic cyclic group is bonded to the oxygen atom (—O—) at the terminal of the carbonyloxy group [—C(O)—O—] of an acrylate ester (namely, a structure in which the hydrogen atom of the carboxyl group of acrylic acid has been substituted with the aliphatic cyclic group) is particularly desirable.

As the structural unit (a21), structural units represented by general formula (1) shown below are preferred.

[Chemical Formula 28]

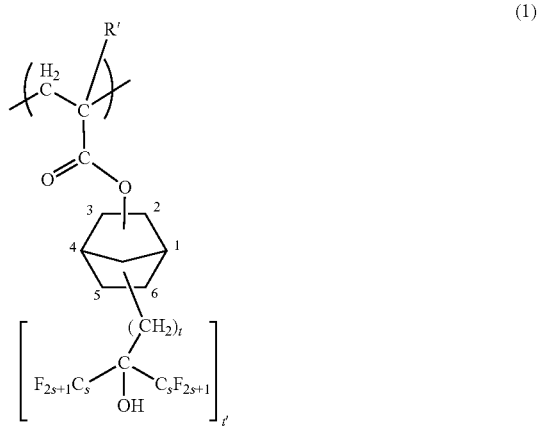

wherein R' represents a hydrogen atom, a halogen atom, an alkyl group or a halogenated alkyl group, and s, t and t' each independently represents an integer of 1 to 5.

In formula (1), R' represents a hydrogen atom, a halogen atom, an alkyl group or a halogenated alkyl group. Examples of the halogen atom, alkyl group or halogenated alkyl group for R' include the same groups as those exemplified above for the halogen atom, alkyl group or halogenated alkyl group that may be bonded to the α-position of the above-mentioned acrylate ester.

Examples of the halogen atom for R' include a fluorine atom, chlorine atom, bromine atom or iodine atom, and a fluorine atom is particularly preferred.

As the alkyl group for R', a lower alkyl group of not more than 5 carbon atoms is preferred, and examples thereof include a methyl group, ethyl group, propyl group, isopropyl group, n-butyl group, isobutyl group, tert-butyl group, pentyl group, isopentyl group or neopentyl group, and a methyl group is particularly desirable.

The halogenated alkyl group for R' is preferably a group in which at least one hydrogen atom of a lower alkyl group of not more than 5 carbon atoms has been substituted with a halogen atom. Specific examples of the alkyl group include the same groups as those exemplified above. The hydrogen atoms substituted by the halogen atoms may represent some or all of the hydrogen atoms that constitute the alkyl group.

In the present invention, R' is preferably a hydrogen atom or an alkyl group, and in terms of industrial availability, is most preferably a hydrogen atom or a methyl group.

Each s independently represents an integer of 1 to 5, preferably an integer of 1 to 3, and most preferably 1.

t represents an integer of 1 to 5, preferably an integer of 1 to 3, and most preferably 1.

t' represents an integer of 1 to 3, preferably an integer of 1 to 2, and most preferably 1.

The structural unit (a21) represented by general formula (1) preferably has a 2-norbornyl group or 3-norbornyl group bonded to the terminal of the carboxyl group of the (α-lower alkyl)acrylic acid. The fluorinated alkyl alcohol is preferably bonded to the 5th or 6th position of the norbornyl group.

The structural unit (a21) may use either one type of structural unit, or a mixture of two or more types.

The proportion of the structural unit (a21) within the resin (A2), relative to the combined total of all the structural units that constitute the resin (A2), is preferably within a range from 10 to 90 mol %, more preferably from 20 to 90 mol %, still more preferably from 40 to 90 mol %, and most preferably from 45 to 85 mol %. Making this proportion at least as large as the lower limit of the above-mentioned range ensures that the effects obtained by including the structural unit (a21) are achieved satisfactorily, whereas by ensuring that the proportion is not more than the upper limit of the above-mentioned range, a favorable balance can be achieved with the other structural units.

Structural Unit (a22)

In addition to the structural unit (a21), the resin (A2) preferably also includes a structural unit (a22) derived from an acrylate ester containing a hydroxyl group-containing aliphatic cyclic group.

When a resin (A2) that includes the structural unit (a22) is blended into the negative resist composition, the hydroxyl group (the alcoholic hydroxyl group) of this structural unit (a22) reacts with the component (C) under the action of the acid generated from the component (B), and this reaction causes the resin (A2) to change from a state that is soluble in the alkali developing solution to a state that is insoluble.

The expression "hydroxyl group-containing aliphatic cyclic group" describes a group in which a hydroxyl group is bonded to an aliphatic cyclic group.

The number of hydroxyl groups bonded to the aliphatic cyclic group is preferably within a range from 1 to 3, and is most preferably 1.

The aliphatic cyclic group may be either monocyclic or polycyclic, but is preferably a polycyclic group. Furthermore, an alicyclic hydrocarbon group is preferred. Moreover, a saturated group is preferred. Furthermore, the number of carbon atoms within the aliphatic cyclic group is preferably within a range from 5 to 15.

Specific examples of the aliphatic cyclic group (prior to bonding of the hydroxyl group) include the same aliphatic cyclic groups as those exemplified above in relation to the structural unit (a21).

As the aliphatic cyclic group of the structural unit (a22), of the groups described above, a cyclohexyl group, adamantyl group, norbornyl group and tetracyclododecanyl group are readily available commercially, and are consequently preferred. Of these, a cyclohexyl group or adamantyl group is particularly preferred, and an adamantyl group is the most desirable.

Besides the hydroxyl group, a linear or branched alkyl group of 1 to 4 carbon atoms may also be bonded to the aliphatic cyclic group.

In the structural unit (a22), the hydroxyl group-containing aliphatic cyclic group is preferably bonded to the ester group (—C(O)—O—) of the acrylate ester.

In such cases, in the structural unit (a22), another substituent may be bonded to the α-position (the α-position carbon atom) of the acrylate ester instead of a hydrogen atom. Examples of preferred substituents include an alkyl group, a halogenated alkyl group or a halogen atom.

Examples of these substituents are as described for R' in general formula (1) of the structural unit (a21) described above. Of the various moieties that can be bonded to the α-position, a hydrogen atom or an alkyl group is preferred, a hydrogen atom or a methyl group is more preferred, and a hydrogen atom is the most desirable.

As specific examples of the structural unit (a22), structural units represented by general formula (2) shown below are preferred.

[Chemical Formula 29]

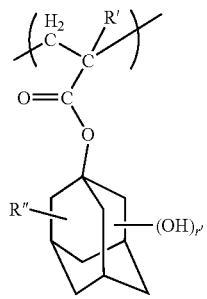

wherein R' is as defined above, R" represents a hydrogen atom, an alkyl group or an alkoxy group of 1 to 5 carbon atoms, and r' represents an integer of 1 to 3.

R' is as defined above for R' in general formula (1).

The alkyl group for R" is as defined above for the alkyl group for R'.

In general formula (2), R' and R" are both most preferably hydrogen atoms.

r' represents an integer of 1 to 3, and is most preferably 1.

Although there are no particular limitations on the bonding position of the hydroxyl group, units in which the hydroxyl group is bonded to the 3rd position of the adamantyl group are preferred.

The structural unit (a22) may use either one type of structural unit, or a mixture of two or more types.

The proportion of the structural unit (a22) within the resin (A2), relative to the combined total of all the structural units that constitute the resin (A2), is preferably within a range from 10 to 70 mol %, more preferably from 10 to 50 mol %, and most preferably from 20 to 40 mol %. Making this proportion at least as large as the lower limit of the above-mentioned range ensures that the effects obtained by including the structural unit (a22) are achieved satisfactorily, whereas by ensuring that the proportion is not more than the upper limit of the above-mentioned range, a favorable balance can be achieved with the other structural units.

Structural Unit (a23)

In addition to the structural unit (a21), or in addition to both the structural unit (a21) and the structural unit (a22), the resin (A2) preferably also includes a structural unit (a23) derived from an acrylic acid that has no cyclic structure and has an alcoholic hydroxyl group on a side chain.

When a resin (A2) that includes the structural unit (a23) is blended into the negative resist composition, the alcoholic hydroxyl group of this structural unit (a23) reacts with the component (C), together with the hydroxyl group of the structural unit (a22), under the action of the acid generated from the component (B).

Accordingly, the resin (A2) changes more readily from a state that is soluble in the alkali developing solution to a state that is insoluble, which has the effect of improving the lithography properties such as the resolution. Further, thickness loss can also be suppressed. Furthermore, the controllability of the cross-linking reaction that occurs during pattern formation improves. Moreover, the film density also tends to increase. As a result, the heat resistance tends to improve. Moreover, the etching resistance also improves.

In the structural unit (a23), the expression "has no cyclic structure" means that the structural unit includes no aliphatic cyclic groups or aromatic groups.

The structural unit (a23) is readily distinguishable from the structural unit (a22) as a result of having no cyclic structure.

Examples of structural units that include an alcoholic hydroxyl group on a side chain include structural units having a hydroxyalkyl group.

Examples of this hydroxyalkyl group include the same hydroxyalkyl groups as those within the "fluorinated hydroxyalkyl group" described above in relation to the structural unit (a21).

The hydroxyalkyl group may, for example, be bonded directly to the α-position carbon atom of the main chain (the portion formed by cleavage of the ethylenic double bond of the acrylic acid), or may form an ester group through substitution of the hydrogen atom of the acrylic acid carboxyl group.

In the structural unit (a23), the hydroxyalkyl group preferably exists at either one, or both of these locations.

In those cases where the hydroxyalkyl group is not bonded to the α-position, the hydrogen atom at the α-position carbon atom may be replaced with an alkyl group, a halogenated alkyl group or a halogen atom. These substituents are as defined above for R' within general formula (1).

As the structural unit (a23), structural units represented by general formula (3) shown below are preferred.

[Chemical Formula 30]

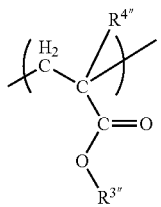

(3)

wherein $R^{4''}$ represents a hydrogen atom, an alkyl group, a halogenated alkyl group, a halogen atom or a hydroxyalkyl group, and $R^{3''}$ represents a hydrogen atom, an alkyl group or a hydroxyalkyl group, provided that at least one of $R^{4''}$ and $R^{3''}$ represents a hydroxyalkyl group.

The hydroxyalkyl group for $R^{4''}$ is preferably a hydroxyalkyl group of not more than 10 carbon atoms, is preferably a linear or branched group, is more preferably a hydroxyalkyl group of 2 to 8 carbon atoms, and is most preferably a hydroxymethyl group or a hydroxyethyl group.

There are no particular limitations on the number of hydroxyl groups or the bonding positions of those groups, although one hydroxyl group is typical, and the hydroxyl group is preferably bonded to the terminal of the alkyl group.

The alkyl group for $R^{4''}$ is preferably an alkyl group of not more than 10 carbon atoms, even more preferably an alkyl group of 2 to 8 carbon atoms, and is most preferably an ethyl group or a methyl group.

The halogenated alkyl group for $R^{4''}$ is preferably a lower alkyl group of not more than 5 carbon atoms (most preferably an ethyl group or methyl group) in which some or all of the hydrogen atoms have been substituted with halogen atoms (and preferably fluorine atoms).

Examples of the halogen atom include a fluorine atom, chlorine atom, bromine atom or iodine atom, and a fluorine atom is particularly desirable.

As the alkyl group and hydroxyalkyl group for $R^{3''}$, the same groups as the alkyl group and hydroxyalkyl group for $R^{4''}$ can be exemplified.

Specific examples of the structural units represented by general formula (3) include structural units derived from α-(hydroxyalkyl)acrylic acids (but not including structural units derived from acrylate esters), structural units derived from alkyl α-(hydroxyalkyl)acrylate esters, and structural units derived from hydroxyalkyl (α-alkyl)acrylate esters.

Of these, including a structural unit derived from an alkyl α-(hydroxyalkyl)acrylate ester as the structural unit (a23) is preferred in terms of improving the film density. Of the various possibilities, structural units derived from ethyl α-(hydroxymethyl)acrylate or methyl α-(hydroxymethyl)acrylate are particularly desirable.

Furthermore, including a structural unit derived from a hydroxyalkyl (α-alkyl)acrylate ester as the structural unit (a23) is preferred in terms of improving the cross-linking efficiency. Of such units, structural units derived from hydroxyethyl α-methyl-acrylate or hydroxymethyl α-methyl-acrylate are particularly desirable.

The structural unit (a23) may use either one type of structural unit, or a mixture of two or more types.

The proportion of the structural unit (a23) within the resin (A2), relative to the combined total of all the structural units that constitute the resin (A2), is preferably within a range from 5 to 50 mol %, more preferably from 5 to 40 mol %, still more preferably from 5 to 30 mol %, and most preferably from 10 to 25 mol %. Making this proportion at least as large as the lower limit of the above-mentioned range ensures that the effects obtained by including the structural unit (a23) are achieved satisfactorily, whereas by ensuring that the proportion is not more than the upper limit of the above-mentioned range, a favorable balance can be achieved with the other structural units.

Other Structural Units

Besides each of the structural units (a21) to (a23) described above, the resin (A2) may also include other copolymerizable structural units.

As such structural units, any of the structural units used in known resin components of conventional chemically amplified resist compositions can be used. An example is a structural unit (a24) derived from an acrylate ester that includes a lactone-containing monocyclic or polycyclic group.

Examples of the structural unit (a24) include the same structural units as those exemplified above for the structural unit (a6) of the above-mentioned positive resist composition.

The structural unit (a24) may use either one type of structural unit, or a mixture of two or more types.

If the structural unit (a24) is included in the resin (A2), then the proportion of the structural unit (a24) within the resin (A2), relative to the combined total of all the structural units that constitute the resin (A2), is preferably within a range from 10 to 70 mol %, more preferably from 10 to 40 mol %, and most preferably from 10 to 25 mol %. Making this proportion at least as large as the lower limit of the above-mentioned range ensures that the effects obtained by including the structural unit (a24) are achieved satisfactorily, whereas by ensuring that the proportion is not more than the upper limit of the above-mentioned range, a favorable balance can be achieved with the other structural units.

However, in the present invention, the resin (A2) is preferably a resin in which the structural units (a21) to (a23) represent the main components.

Here, the term "main components" means that the combined quantity of the structural units (a21) to (a23) represents at least 50 mol %, preferably at least 70 mol %, and more preferably 80 mol % or more, of all the structural units. Resins (A2) in which this proportion is 100 mol %, namely resins (A2) composed solely of the structural unit (a21), the structural unit (a22) and the structural unit (a23), are the most desirable.

As the resin (A2), resins that include a combination of structural units such as that represented by formula (A2-1) shown below are particularly desirable.

[Chemical Formula 31]

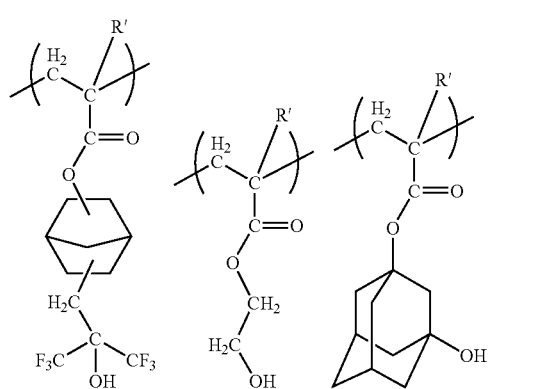

(A2-1)

wherein, R' is as defined above.

In the present invention, the weight average molecular weight (Mw, the polystyrene equivalent weight average molecular weight determined by gel permeation chromatography) of the resin (A2) is preferably within a range from 2,000 to 30,000, more preferably from 2,000 to 10,000, and most preferably from 3,000 to 8,000. Ensuring a molecular weight within this range is preferred in terms of obtaining a favorable dissolution rate within an alkali developing solution, and achieving a high level of resolution. For the weight average molecular weight, lower values within the above-mentioned range tend to yield more favorable properties.

Further, the dispersity (Mw/Mn) is preferably within a range from 1.0 to 5.0, and more preferably from 1.0 to 2.5.

When the resin (A2) is used in the component (A"), one type of the resin (A2) may be used alone, or a mixture of two or more types may be used.

In those cases where the resin (A2) is used, the proportion of the resin (A2) within the component (A") is preferably at least 50% by weight, more preferably at least 70% by weight, still more preferably 80% by weight or greater, and is most preferably 100% by weight.

The component (A") used in the present invention can be synthesized, for example, by a method in which the monomers that give rise to each of the structural units are subjected to a radical polymerization, such as the method disclosed in WO 2004/076495 pamphlet.

Besides the resin (A1) and the resin (A2), the component (A") may also contain other polymer compounds typically used within conventional negative resist compositions (such as hydroxystyrene resins, novolak resins or acrylic resins).

In the present invention, the quantity of the component (A") within the negative resist composition may be adjusted in accordance with the resist film thickness that is to be formed.

[Component (B)]

The component (B) can be selected appropriately from the many known materials used as acid generators in conventional chemically amplified resists.

Examples of the component (B) include the same materials as those exemplified above for the component (B) of the above-mentioned first resist composition.

As the component (B), either a single type of acid generator may be used alone, or a combination of two or more types may be used.

In the present invention, of the various possibilities, the use of a diazomethane-based acid generator is preferred, and the use of bis(2,4-dimethylphenylsulfonyl)diazomethane is the most desirable.

The quantity used of the component (B) is typically within a range from 1 to 20 parts by weight, and preferably from 2 to 10 parts by weight, per 100 parts by weight of the component (A"). Ensuring the quantity is at least as large as the lower limit of the above-mentioned range yields satisfactory pattern formation, whereas by ensuring that the quantity is not more than the upper limit of the above-mentioned range, a uniform solution can be obtained and favorable storage stability can be achieved.

[Component (C)]

There are no particular limitations on the component (C), which may be selected appropriately from the various cross-linkers used within conventional chemically amplified negative resist compositions.

Specific examples include aliphatic cyclic hydrocarbons containing a hydroxyl group and/or a hydroxyalkyl group, or oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane.

Furthermore, other examples include compounds produced by reacting an amino group-containing compound such as melamine, acetoguanamine, benzoguanamine, urea, ethylene urea, propylene urea or glycoluril with either formaldehyde or a combination of formaldehyde and a lower alcohol, thereby substituting the hydrogen atoms of the amino group with hydroxymethyl groups or lower alkoxymethyl groups.

Of these, compounds that use melamine are referred to as melamine-based cross-linkers, compounds that use urea are referred to as urea-based cross-linkers, compounds that use an alkylene urea such as ethylene urea or propylene urea are referred to as alkylene urea-based cross-linkers, and compounds that use glycoluril are referred to as glycoluril-based cross-linkers.

As the component (C), at least one type of cross-linker selected from the group consisting of melamine-based cross-linkers, urea-based cross-linkers, alkylene urea-based cross-linkers and glycoluril-based cross-linkers is preferred, and a glycoluril-based cross-linker is particularly desirable.

Examples of the melamine-based cross-linkers include compounds obtained by reacting melamine with formaldehyde, thereby substituting the hydrogen atoms of the amino groups with hydroxymethyl groups, and compounds obtained by reacting melamine with formaldehyde and a lower alcohol, thereby substituting the hydrogen atoms of the amino groups with lower alkoxymethyl groups. Specific examples include hexamethoxymethylmelamine, hexaethoxymethylmelamine, hexapropoxymethylmelamine and hexabutoxybutylmelamine, and of these, hexamethoxymethylmelamine is preferred.

Examples of the urea-based cross-linkers include compounds obtained by reacting urea with formaldehyde, thereby substituting the hydrogen atoms of the amino groups with hydroxymethyl groups, and compounds obtained by reacting urea with formaldehyde and a lower alcohol, thereby substituting the hydrogen atoms of the amino groups with lower alkoxymethyl groups. Specific examples include bismethoxymethylurea, bisethoxymethylurea, bispropoxymethylurea and bisbutoxymethylurea, and of these, bismethoxymethylurea is preferred.

Examples of the alkylene urea-based cross-linkers include compounds represented by general formula (C-1) shown below.

[Chemical Formula 32]

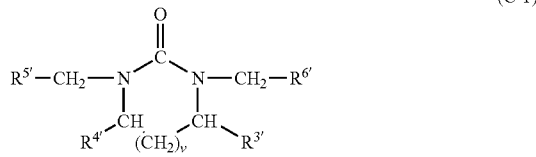

(C-1)

wherein $R^{5'}$ and $R^{6'}$ each independently represents a hydroxyl group or a lower alkoxy group, $R^{3'}$ and $R^{4'}$ each independently represents a hydrogen atom, a hydroxyl group or a lower alkoxy group, and v represents 0 or an integer of 1 to 2.

The lower alkoxy group for $R^{5'}$ and $R^{6'}$ may be either a linear or branched group, and is preferably an alkoxy group of 1 to 4 carbon atoms. $R^{5'}$ and $R^{6'}$ may be either the same or different, and are preferably the same.

The lower alkoxy group for $R^{3'}$ and $R^{4'}$ may be either a linear or branched group, and is preferably an alkoxy group of 1 to 4 carbon atoms. $R^{3'}$ and $R^{4'}$ may be either the same or different, and are preferably the same.

v is either 0 or an integer from 0 to 2, and is preferably 0 or 1.

As the alkylene urea-based cross-linker, compounds in which v is 0 (ethylene urea-based cross-linkers) and/or compounds in which v is 1 (propylene urea-based cross-linkers) are preferred.

Compounds represented by general formula (C-1) can be obtained by a condensation reaction between an alkylene urea and formalin, and by further reacting the resulting product with a lower alcohol.

Specific examples of the alkylene urea-based cross-linkers include ethylene urea-based cross-linkers such as mono- and/or di-hydroxymethylated ethylene urea, mono- and/or di-methoxymethylated ethylene urea, mono- and/or di-ethoxymethylated ethylene urea, mono- and/or di-propoxymethylated ethylene urea, and mono- and/or di-butoxymethylated ethylene urea; propylene urea-based cross-linkers such as mono- and/or di-hydroxymethylated propylene urea, mono- and/or di-methoxymethylated propylene urea, mono- and/or di-ethoxymethylated propylene urea, mono- and/or di-propoxymethylated propylene urea, and mono- and/or di-butoxymethylated propylene urea; as well as 1,3-di(methoxymethyl)-4,5-dihydroxy-2-imidazolidinone, and 1,3-di(methoxymethyl)-4,5-dimethoxy-2-imidazolidinone.

Examples of the glycoluril-based cross-linkers include glycoluril derivatives in which the N-position is substituted with either one or both of a hydroxyalkyl group and an alkoxyalkyl group of 1 to 4 carbon atoms. These glycoluril derivatives can be obtained by a condensation reaction between glycoluril and formalin, and by further reacting the resulting product with a lower alcohol.

Specific examples of the glycoluril-based cross-linkers include mono-, di-, tri- and/or tetra-hydroxymethylated glycoluril, mono-, di-, tri- and/or tetra-methoxymethylated glycoluril, mono-, di-, tri- and/or tetra-ethoxymethylated glycoluril, mono-, di-, tri- and/or tetra-propoxymethylated glycoluril, and mono-, di-, tri- and/or tetra-butoxymethylated glycoluril.

As the component (C), one type of cross-linker may be used alone, or two or more types may be used in combination.

The quantity of the component (C) is preferably within a range from 1 to 50 parts by weight, more preferably from 3 to 30 parts by weight, still more preferably from 3 to 15 parts by weight, and most preferably from 5 to 10 parts by weight, relative to 100 parts by weight of the component (A'). By ensuring that the quantity of the component (C) is at least as large as the lower limit of the above-mentioned range, the formation of cross-linking is able to proceed satisfactorily, and a favorable resist pattern with minimal swelling is obtained. On the other hand, by ensuring that the quantity is not more than the upper limit of the above-mentioned range, the storage stability of the resist coating liquid improves, and deterioration over time in the sensitivity can be suppressed.

[Component (S")]

In the present invention, the negative resist composition used as the second resist composition includes an ether-based organic solvent (S") having no hydroxyl groups. As well as hydroxyl groups, the solvent preferably also has no carbonyl groups.

By including the component (S"), when the negative resist composition is applied to the top of the support having the above-mentioned first resist pattern formed thereon, the first resist pattern is less likely to dissolve, meaning thickness loss from the first resist pattern can be reduced. Moreover, the shape of the first resist pattern is better retained, even after double patterning or the like. Furthermore, a resist pattern can be formed stably using a double patterning method.

In the present invention, as the component (S"), compounds represented by a general formula shown below are preferred.

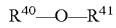

$R^{40}$—O—$R^{41}$ wherein $R^{40}$ and $R^{41}$ each independently represents a hydrocarbon group. Further, $R^{40}$ and $R^{41}$ may be bonded together to form a ring. —O— represents an ether linkage.

In the above formula, examples of the hydrocarbon groups for $R^{40}$ and $R^{41}$ include alkyl groups and aryl groups, and alkyl groups are preferred. Of the various possibilities, compounds in which $R^{40}$ and $R^{41}$ are both alkyl groups are preferred, and compounds in which $R^{40}$ and $R^{41}$ represent the same alkyl group are particularly desirable.

There are no particular limitations on the alkyl groups for $R^{40}$ and $R^{41}$, and examples thereof include linear, branched or cyclic alkyl groups of 1 to 20 carbon atoms. In these alkyl groups, some or all of the hydrogen atoms may or may not be substituted with halogen atoms.

In terms of achieving favorably coating properties for the negative resist composition, the alkyl groups preferably contain from 1 to 15 carbon atoms, and more preferably 1 to 10 carbon atoms. Specific examples thereof include an ethyl group, propyl group, isopropyl group, n-butyl group, isobutyl group, n-pentyl group, isopentyl group, cyclopentyl group or hexyl group, and of these, an n-butyl group or isopentyl group is particularly preferred.

As the halogen atom that may be used for substitution of a hydrogen atom of the alkyl group, a fluorine atom is preferred.

There are no particular limitations on the aryl groups for $R^{40}$ and $R^{41}$, and examples thereof include aryl groups of 6 to 12 carbon atoms, wherein some or all of the hydrogen atoms of these aryl groups may or may not be substituted with alkyl groups, alkoxy groups or halogen atoms or the like.

In terms of enabling low-cost synthesis, an aryl group of 6 to 10 carbon atoms is preferred. Specific examples thereof include a phenyl group, benzyl group or naphthyl group.

As the alkyl group that may be used for substitution of a hydrogen atom of the aryl group, an alkyl group of 1 to 5 carbon atoms is preferred, and a methyl group, ethyl group, propyl group, n-butyl group or tert-butyl group is particularly desirable.

As the alkoxy group that may be used for substitution of a hydrogen atom of the aryl group, an alkoxy group of 1 to 5 carbon atoms is preferred, and a methoxy group or ethoxy group is particularly desirable. As the halogen atom that may be used for substitution of a hydrogen atom of the aryl group, a fluorine atom is preferred.

Further, in the above formula, $R^{40}$ and $R^{41}$ may be bonded together to form a ring.

In such a case, $R^{40}$ and $R^{41}$ each independently represents a linear or branched alkylene group (and preferably an alkylene group of 1 to 10 carbon atoms), and the terminal of $R^{40}$ is bonded to the terminal of $R^{41}$ to form a ring. Further, a carbon atom within the alkylene chain may be substituted with an oxygen atom.

Specific examples of this type of ether-based organic solvent include 1,8-cineole, tetrahydrofuran and dioxane.

Furthermore, the boiling point (under normal pressure) of the ether-based organic solvent is preferably within a range from 30 to 300° C., more preferably from 100 to 200° C., and still more preferably from 140 to 180° C. Ensuring that the boiling point is at least as high as the lower limit of the above-mentioned range means the component (S") is less likely to evaporate during the spin coating used for applying the negative resist composition, thereby suppressing coating irregularities and improving the coating properties. On the other hand, by ensuring that the boiling point is not more than the upper limit of the above-mentioned range, the component (S") can be satisfactorily removed from the applied resist film during prebaking, thus improving the resist pattern formability.

Moreover, a boiling point within the above range also reduces thickness loss for the resist pattern, and improves the stability of the composition during storage. Furthermore, a boiling point within the above range is also preferred from the viewpoints of the heating temperature required within the PAB and PEB steps.

Specific examples of the ether-based organic solvent include 1,8-cineole (boiling point: 176° C.), dibutyl ether (boiling point: 142° C.), diisobutyl ether (boiling point: 171° C.), dioxane (boiling point: 101° C.), anisole (boiling point: 155° C.), ethyl benzyl ether (boiling point: 189° C.), diphenyl ether (boiling point: 259° C.), dibenzyl ether (boiling point: 297° C.), phenetole (boiling point: 170° C.), butyl phenyl ether, tetrahydrofuran (boiling point: 66° C.), ethyl propyl ether (boiling point: 63° C.), diisopropyl ether (boiling point: 69° C.), dihexyl ether (boiling point: 226° C.), and dipropyl ether (boiling point: 91° C.).

As the component (S"), either a single type of organic solvent may be used alone, or two or more types may be used in combination.

In the present invention, from the viewpoints of achieving a favorable reduction in thickness loss from the resist pattern, a cyclic or chain-like ether-based organic solvent is preferred as the component (S"), and at least one solvent selected from the group consisting of 1,8-cineole, dibutyl ether and diisopentyl ether is particularly desirable.

In the negative resist composition, an organic solvent other than the component (S") (hereafter referred to as "component (S2)") may be used in combination with the component (S"). By using the component (S2) in combination with the component (S"), the solubility and other properties of the component (A") can be adjusted.

As the component (S2), one or more known solvents may be selected from solvents typically used for conventional chemically amplified resists.

Examples of the solvent (S2) include the same solvents as those exemplified above in relation to the component (S) within the above-mentioned first resist composition (but excluding solvents of the component (S")).

In the present invention, it is thought that in those cases where the component (A) used in the first resist composition has few polar groups, the first resist pattern formed from the first resist composition is particularly resistant to thickness loss, although a component (S2) that has a certain degree of polarity may still be used in combination with the component (S").

There are no particular limitations on the total quantity used of the component (S"), and a quantity that yields a negative resist composition having a concentration that is suitable for application to a support is normally used.

[Optional Components]

In order to improve factors such as the resist pattern shape and the post exposure stability of the latent image formed by the pattern-wise exposure of the resist layer, it is preferable that the negative resist composition further includes a nitrogen-containing organic compound (D) (hereafter referred to as "component (D)") as an optional component.

A multitude of these components (D) have already been proposed, and any of these known compounds may be used, although a cyclic amine, an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines).

Specific examples include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Among these, alkyl alcohol amines and trialkylamines are preferable, and alkyl alcohol amines are the most desirable. Of these alkyl alcohol amines, triethanolamine and triisopropanolamine are the most preferred.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

One of the above compounds may be used alone, or two or more compounds may be used in combination.

Of the various possibilities, the component (D) is preferably an alkyl alcohol amine, more preferably a tertiary alkanolamine, and is most preferably triisopropanolamine.

The component (D) is typically used in an amount within a range from 0.01 to 5.0 parts by weight, relative to 100 parts by weight of the component (A").

In the present invention, using an amine such as those described above as the component (D) facilitates the obtaining of a favorable pattern shape. Although the reason is not entirely clear, it is thought that the amine is readily retained within the resist film, even following the bake treatment conducted during resist pattern formation.

As a result, it is thought that the second resist film formed using the negative resist composition is less likely to be affected by residual alkali developing solution left following formation of the first resist pattern, thereby suppressing dissolution of the second resist film and facilitating the formation of a favorable pattern shape. Of the various amines, the use of an amine having a high boiling point is preferred.

Furthermore, in the negative resist composition according to the present invention, in order to prevent any deterioration in sensitivity, and improve the resist pattern shape and the post exposure stability of the latent image formed by the pattern-wise exposure of the resist layer, at least one compound (E) (hereafter referred to as "component (E)") selected from the group consisting of organic carboxylic acids and phosphorus oxo acids and derivatives thereof may also be added as an optional component.

Examples of the component (E) include the same compounds as those exemplified above for the component (E) of the above-mentioned positive resist composition.

As the component (E), one type of compound may be used alone, or two or more types may be used in combination.

As the component (E), an organic carboxylic acid is preferred, and salicylic acid is particularly desirable.

The component (E) is typically used in a quantity within a range from 0.01 to 5.0 parts by weight, relative to 100 parts by weight of the component (A').

If desired, other miscible additives may also be added to the negative resist composition. Examples of such miscible additives include additive resins for improving the performance of the resist film, surfactants for improving the coating properties, dissolution inhibitors, plasticizers, stabilizers, colorants, halation prevention agents, and dyes.

<Method of Forming Resist Pattern>

The method of forming a resist pattern according to the present invention includes: forming a first resist film by applying the first resist composition to a support (hereafter frequently referred to as the "film formation step (1)"), forming a first resist pattern by selectively exposing the first resist film through a first mask pattern and then developing the first resist film (hereafter frequently referred to as the "patterning step (1)"), forming a second resist film by applying the negative resist composition containing the ether-based organic solvent (S") having no hydroxyl groups onto the support having the first resist pattern formed thereon (hereafter frequently referred to as the "film formation step (2)"), and forming a resist pattern by selectively exposing the second resist film through a second mask pattern and then developing the second resist film (hereafter frequently referred to as the "patterning step (2)").

A preferred embodiment of the method of forming a resist pattern according to the present invention is described below with reference to FIG. 1A to FIG. 1D. This embodiment represents an example in which a positive resist composition is used for the first resist composition.

In this embodiment, first, as shown in FIG. 1A, the first resist composition (the positive resist composition) is applied onto a support 1 to form a first resist film 2.

Figure 1B:
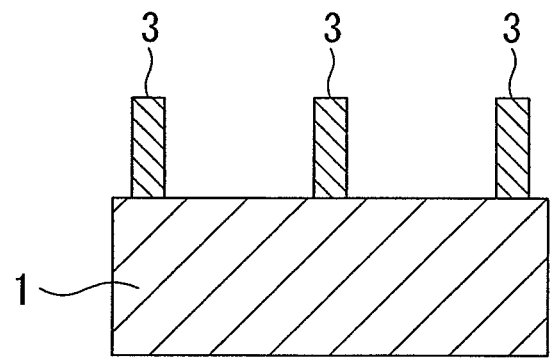
FIG. 1B is a schematic process diagram describing a preferred embodiment of a method of forming a resist pattern according to the present invention.

Next, as shown in FIG. 1B, the first resist film 2 is selectively exposed and then developed, thereby forming a plurality of resist patterns 3.

Figure 1C:
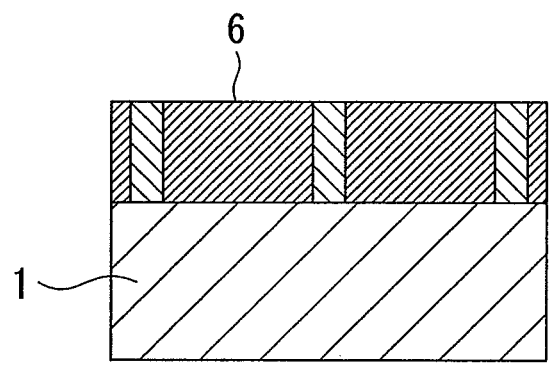
FIG. 1C is a schematic process diagram describing a preferred embodiment of a method of forming a resist pattern according to the present invention.

Subsequently, as shown in FIG. 1C, the second resist composition (the negative resist composition) is applied onto the support 1 having the plurality of resist patterns 3 formed thereon, thus forming a second resist film 6 that fills the spaces between the plurality of resist patterns 3.

Figure 1D:
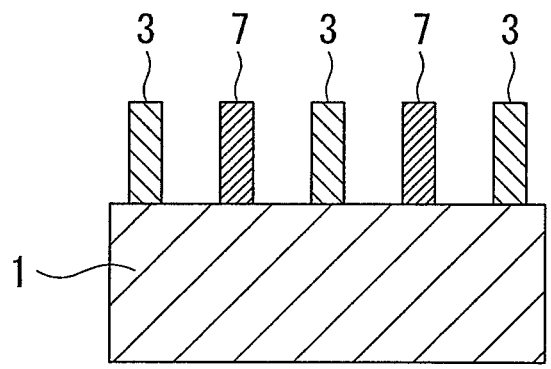
FIG. 1D is a schematic process diagram describing a preferred embodiment of a method of forming a resist pattern according to the present invention.

Next, as shown in FIG. 1D, the second resist film 6 is selectively exposed in a different position from the position used for forming the plurality of resist patterns 3, and the second resist film 6 is then developed. This developing removes the unexposed portions of the second resist film 6, and as a result, a resist pattern composed of a plurality of resist patterns 7 is formed on the support.

In this manner, by using the embodiment shown in FIG. 1A to FIG. 1D, a dense resist pattern with a narrower pitch than that of the resist pattern 3 formed in the patterning step (1) is formed on the support 1.

A more detailed description of each of the steps is provided below.

[Film Formation Step (1)]

There are no particular restrictions on the support 1, and conventional supports can be used, including substrates for electronic componentry, as well as substrates on which a predetermined wiring pattern has already been formed. Specific examples of suitable supports include silicon wafers, metal-based substrates such as copper, chrome, iron, and aluminum, as well as glass substrates. Suitable materials for the wiring pattern include copper, aluminum, nickel, and gold.

Further, as the support 1, an inorganic and/or organic film may be provided on the surface of an aforementioned substrate. Examples of inorganic films include inorganic antireflective films (inorganic BARC). Examples of organic films include organic antireflective films (organic BARC) and organic films such as the lower layer film in a multilayer resist method. If a lower layer film is provided, then a pattern having a high aspect ratio can be formed on the substrate, which is particularly desirable in the production and the like of semiconductors.

Here, a "multilayer resist method" describes a method in which at least one organic film (the lower layer film) and at least one resist film are provided on top of a substrate, and a resist pattern formed in the upper layer resist film is then used as a mask for conducting patterning of the lower layer, and is regarded as a method that is capable of forming patterns having a high aspect ratio. Multilayer resist methods can be basically classified as either methods that yield a two-layer structure composed of a resist film and a lower layer film, or methods that yield a multilayer structure of three or more layers in which one or more intermediate layers (such as thin metal films) are provided between the resist film and the lower layer film. According to a multilayer resist method, by using the lower layer film to ensure the desired level of thickness, the resist film can be formed as a very thin film, enabling the formation of a very fine pattern having a high aspect ratio.

In those cases where an organic film is provided, the organic film can be formed, for example, by using a spinner or the like to apply an organic film-forming material, prepared by dissolving a resin component or the like that forms the organic film in an organic solvent, to the surface of the substrate, and then conducting a bake treatment under conditions that include heating at a temperature that is preferably within a range from 200 to 300° C., for a period that is preferably from 30 to 300 seconds, and more preferably for 60 to 180 seconds.

The organic film-forming material is described in more detail below.

The thickness of the organic film is preferably within a range from 10 to 500 nm, and is more preferably from 50 to 450 nm. Ensuring a thickness within this range yields favorable effects, such as enabling the formation of a pattern with a high aspect ratio, and ensuring that a satisfactory level of etching resistance is obtained during etching of the substrate.

The first resist composition may be appropriately selected from the negative resist compositions and positive resist compositions described above.

The first resist film 2 can be formed by applying the first resist composition onto the support. Application of the first resist composition can be conducted by a conventional method using a spinner or the like.

Specifically, the first resist film 2 can be formed, for example, by using a spinner or the like to apply the first resist composition to the surface of the support, and then conducting a bake treatment (a prebake) under temperature conditions within a range from 80 to 150° C., for a period of 40 to 120 seconds and preferably for 60 to 90 seconds, to volatilize the organic solvent.

The thickness of the resist film 2 is preferably within a range from 50 to 500 nm, and is more preferably from 50 to 450 nm. Ensuring a thickness within this range yields favorable effects, such as enabling the formation of a resist pattern at a high resolution, and ensuring that a satisfactory level of resistance to etching is obtained.

[Patterning Step (1)]

The patterning step (1) can be conducted using conventional methods, for example, by selectively exposing the first resist film 2 through a mask having a predetermined pattern formed therein (namely, a mask pattern), and then conducting a bake treatment (PEB: post exposure baking) under temperature conditions within a range from 80 to 150° C., for a period of 40 to 120 seconds and preferably for 60 to 90 seconds. If alkali developing is then conducted using, for example, an aqueous solution of tetramethylammonium hydroxide (TMAH) with a concentration of 0.1 to 10% by weight, then the exposed portions of the first resist film 2 formed using the first resist composition (the positive resist composition) are removed, thereby forming the first resist pattern 3.

In some cases, a post bake step may be included following the above alkali developing.

There are no particular restrictions on the radiation wavelength used for the exposure, and radiation from a KrF excimer laser, ArF excimer laser, $F_2$ excimer laser, EUV (extreme ultraviolet), VUV (vacuum ultraviolet), EB (electron beam), X-ray or soft X-ray can be used.

At this time, the selective exposure of the first resist film 2 may be conducted either using a normal exposure process (dry exposure), which is performed within air or an inert gas such as nitrogen, or using immersion exposure.

As described above, in immersion exposure, the exposure is conducted in a state where the region between the lens and the resist film formed on the wafer, which has conventionally been filled with air or an inert gas such as nitrogen, is filled with a solvent (a liquid immersion medium) having a larger refractive index than the refractive index of air.

More specifically, immersion exposure can be performed by filling the region between the resist film obtained in the manner described above and the lens at the lowermost point of the exposure apparatus with a solvent (the immersion medium) that has a larger refractive index than the refractive index of air, and then conducting exposure (immersion exposure) through a desired mask pattern in this state.

The immersion medium is preferably a solvent that has a refractive index that is larger than the refractive index of air but smaller than the refractive index of the resist film formed using the first resist composition described above. The refractive index of the solvent is not particularly limited provided it satisfies this range.

Examples of this solvent that has a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and which have a boiling point that is preferably within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of an alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and an example of a suitable perfluoroalkylamine compound is perfluorotributylamine (boiling point: 174° C.).

[Film Formation Step (2)]

Next, the negative resist composition is applied to the support 1 having the first resist pattern 3 formed thereon, thus forming a second resist film 6 that fills the spaces between the plurality of resist patterns 3.

In a similar manner to the first resist film 2, the second resist film 6 may be formed using conventional methods.

The film thickness of the second resist film 6 is preferably either equal to the height of the resist pattern 3 or thicker than the resist pattern 3. In other words, when the support 1 is viewed from the side of the second resist film 6, the surface preferably appears flat.

[Patterning Step (2)]

Subsequently, the second resist film 6 is selectively exposed in a different position from the position used for forming the plurality of resist patterns 3, and the second resist film 6 is then developed. This process forms a resist pattern on the support 1 composed of the plurality of resist patterns 3 and a plurality of newly formed resist patterns 7 in the second resist film 6.

In the present invention, any case in which the exposure position does not exactly coincide with the first resist pattern formed in the patterning step (1) is described as a "different position from the position used for forming the first resist pattern", and this includes both cases in which there is absolutely no overlap, and cases in which partial overlap exists.

In the present invention, there is preferably absolutely no overlap between the position at which the first resist pattern (the resist pattern 3) is formed and the position at which selective exposure is conducted in the patterning step (2). This ensures that a narrow-pitch pattern can be formed in which the spacing between patterns (the pitch) is narrower than that of the first resist pattern formed in the patterning step (1).

The selective exposure at a different position from the position used for forming the first resist pattern (the resist pattern 3) can be conducted, for example, by moving the mask pattern used in the patterning step (1) in a horizontal direction, or by moving the stage (the base on which the substrate is mounted) within the exposure apparatus in a horizontal direction.

This movement of the mask pattern or the stage can be executed by altering the program of the exposure apparatus being used.

The mask pattern or the stage may be moved in parallel in a single direction, or may be rotated. For example, when forming a pattern, a line and space mask pattern having a plurality of lines arranged at a constant pitch may be used to form a sparse line and space pattern in the patterning step (1), and subsequently, in the patterning step (2), by moving the mask pattern in a direction parallel to the direction perpendicular to the direction of the lines, and forming line patterns in positions midway between the individual line patterns formed in the patterning step (1), a line and space resist pattern is formed with a pitch that is approximately ½ of the pitch in the original line and space pattern. Thus, a resist pattern more dense than the first space pattern is formed.

Here, a "sparse pattern" describes a line and space resist pattern having a broad space in which the ratio of line width:space width is 1:2 or greater.

As described above, in the present invention, the first resist pattern is preferably a line and space resist pattern. The present invention then enables the formation of a dense line and space pattern having a narrow pitch.

In a specific example, by forming a line and space pattern (a sparse pattern) in which the line width is 100 nm and the ratio of line width:space width=1:3, subsequently moving the mask pattern 200 nm in a direction perpendicular to the direction of the lines, and once again forming a line and space pattern in which the line width is 100 nm and the ratio of line width:space width=1:3, a line and space pattern (a dense pattern) can be formed in which the line width is 100 nm and the ratio of line width:space width=1:1.

Furthermore, by subjecting the mask pattern used in the patterning step (1) to a rotational movement, or by using a mask pattern that is different from the mask pattern used in the patterning step (1) (for example, by using a line and space mask pattern in the patterning step (1) and using a hole mask pattern in the patterning step (2)), very fine patterns, and/or a multitude of resist patterns can be formed.

In the method of forming a resist pattern according to the present invention, following completion of the patterning step (2) described above, a coating step may be conducted to form a coating film composed of a metal oxide film on the surface of the formed resist pattern. This step coats the surfaces of the resist patterns 3 and the resist patterns 7 with a coating film formed from a metal oxide film, thereby improving the etching resistance and the like.

In the method of forming a resist pattern according to the present invention, following the patterning step (2) described above, the series of operations composed of the coating step mentioned above, the film formation step (2) and the patterning step (2) may be repeated a plurality of times.

In other words, the operation of forming a coated pattern by forming a coating film composed of a metal oxide film on the surface of the formed resist pattern, forming a resist film by applying the negative resist composition to the support having the coated pattern formed thereon, selectively exposing the resist film, and then developing the resist film to form a resist pattern may be conducted a plurality of times. This enables the formation of even denser patterns with even narrower pitches, or the formation of patterns having complex shapes.

In the method of forming a resist pattern according to the present invention, following completion of the patterning step (2) described above, the formed resist pattern may be used as a mask to conduct etching of the support 1.

In other words, in those cases where an organic film is provided on top of the substrate, etching of the organic film can be conducted, and a pattern (an organic film pattern) that is faithful to the resist pattern can be formed in the organic film, and these patterns (the resist pattern and the organic film pattern) can then be used as a mask to conduct etching of the substrate. In those cases where the resist pattern is formed directly on the substrate, the resist pattern can simply be used as a mask for conducting etching of the substrate. By etching the support (a substrate or the like) in this manner, a semiconductor device or the like can be produced.

The etching method may use conventional methods, and for example in the case of etching of an organic film, dry etching is preferred. In terms of ensuring that the coating film has a high level of resistance to the etching, and achieving favorable production efficiency, oxygen plasma etching or etching using $CF_4$ gas or $CHF_3$ gas is preferred, and of these, oxygen plasma etching is particularly desirable.

Etching of the substrate is preferably conducted by etching using a halogen gas or etching using a fluorocarbon-based gas, and etching using either $CF_4$ gas or $CHF_3$ gas is particularly desirable.

(Organic Film-Forming Material)

In the support 1 used in the film formation step (1) described above, an organic film-forming material used for forming the organic film that may be formed on top of the substrate need not necessarily exhibit the type of sensitivity to an electron beam or light source shown by a resist film. The types of resists or resins typically used in the production of semiconductor devices and liquid crystal display elements may be used.

Furthermore, in order to enable etching of the organic film to be conducted using the resist pattern, thereby transferring the resist pattern to the organic film and forming an organic film pattern, the organic film-forming material is preferably a material that is capable of forming an organic film that can be subjected to etching, and particularly dry etching. Of the various possibilities, materials that are capable of forming an organic film that can be etched by the type of oxygen plasma etching mentioned above are particularly preferred.

As this type of organic film-forming material, the materials conventionally used for forming organic films such as organic BARC are suitable. Examples include the ARC series of products manufactured by Brewer Science Ltd., the AR series of products manufactured by Rohm and Haas Company, and the SWK series of products manufactured by Tokyo Ohka Kogyo Co., Ltd.

Of these, in those cases where, as described above, oxygen plasma etching is used in the etching step, the organic film is preferably formed from a material that is readily etched using oxygen plasma etching, but exhibits comparatively high resistance to halogen gases, and specifically to fluorocarbon gases such as $CF_4$ gas or $CHF_3$ gas.

Furthermore, an organic film containing at least one resin component selected from the group consisting of novolak resins, acrylic resins and soluble polyimides may also be formed between the above organic BARC and the substrate.

These materials are ideal for the present invention as they are readily etched by oxygen plasma etching or the like, and also display favorable resistance to fluorocarbon gases. In other words, because etching of the substrate or the like is generally conducted using a halogen gas such as a fluorocarbon gas, by forming the organic film from these types of materials, oxygen plasma etching can be used to improve the processability during formation of the organic film pattern, while the etching resistance can be improved in subsequent steps that use a halogen gas such as a fluorocarbon gas to conduct etching of the substrate.

As these resin components, a single type of resin may be used alone, or a mixture of two or more resins may be used.

Of these materials, novolak resins, and acrylic resins containing an alicyclic region or aromatic ring on a side chain are cheap, widely used, and exhibit excellent resistance to fluorocarbon gas dry etching, and are consequently preferred.

As the novolak resin, any of the resins typically used in positive resist compositions can be used, and positive resists for i-line or g-line radiation containing a novolak resin as the primary component can also be used.

A novolak resin is a resin obtained, for example, by conducting an addition condensation of an aromatic compound containing a phenolic hydroxyl group (hereafter, simply referred to as a "phenol") and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallate esters, α-naphthol, and β-naphthol.

Examples of the aldehyde include formaldehyde, furfural, benzaldehyde, nitrobenzaldehyde, and acetaldehyde.

There are no particular restrictions on the catalyst used in the addition condensation reaction, and suitable acid catalysts include hydrochloric acid, nitric acid, sulfuric acid, formic acid, oxalic acid, and acetic acid.

Commercially available products can be used as the novolak resin.

The lower limit for the weight average molecular weight (Mw) of the novolak resin is preferably 3,000, more preferably 5,000, still more preferably 6,000, and is most preferably 7,000. The upper limit is preferably 50,000, more preferably 30,000, still more preferably 10,000, and is most preferably 9,000.

Provided the value of Mw is at least 3,000, the resin is unlikely to sublime when baked at high temperatures, and is therefore unlikely to contaminate the apparatus and the like. Furthermore, ensuring that the value of Mw is 5,000 or greater yields a superior level of etching resistance to fluorocarbon gases and the like.

Furthermore, provided the value of Mw is not more than 50,000, the resin exhibits favorable filling properties for substrates having very fine unevenness, whereas a value of Mw of 10,000 or less tends to facilitate dry etching.

Novolak resins with a Mw value of 5,000 to 50,000, and preferably from 8,000 to 30,000, in which the quantity of low molecular weight components with a molecular weight of not more than 500, and preferably not more than 200, as measured by gel permeation chromatography, is not more than 1% by weight, and is preferably 0.8% by weight or less, are preferred. The quantity of the low molecular weight components is preferably as small as possible, and is most preferably 0% by weight.

In a novolak resin having a Mw value within the above range, ensuring that the quantity of low molecular weight components with a molecular weight of not more than 500 is 1% by weight or less yields favorable filling properties for substrates having very fine unevenness. The reason why such a reduction in the low molecular weight fraction should improve the filling characteristics remains unclear, although it is surmised that it is a reflection of the dispersity.

Here, the expression "low molecular weight components with a molecular weight of not more than 500" refers to substances that are detected as a low molecular weight fraction of molecular weight 500 or less during GPC analysis using polystyrene standards.

These "low molecular weight components with a molecular weight of not more than 500" include unpolymerized monomers, and low polymerization degree materials, which vary depending on the molecular weight, but include, for example, materials produced by the condensation of 2 to 5 phenol molecules with an aldehyde.

The quantity (weight %) of these low molecular weight components with a molecular weight of not more than 500 is measured by graphing the results of the above GPC analysis with the fraction number across the horizontal axis and the concentration along the vertical axis, and then determining the ratio (%) of the area under the curve within the low molecular weight fraction for molecular weights of not more than 500, relative to the area under the entire curve.

As the acrylic resin, any of the resins typically used in positive resist compositions can be used, and examples include acrylic resins containing structural units derived from a polymerizable compound containing an ether linkage, and structural units derived from a polymerizable compound containing a carboxyl group.

Examples of the polymerizable compound containing an ether linkage include (meth)acrylate derivatives containing both an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate. These compounds may be used either alone, or in combinations of two or more different compounds.

In the present invention, the term "(meth)acrylate" refers to either one or both of the acrylate and the methacrylate.

Examples of the polymerizable compound containing a carboxyl group include monocarboxylic acids such as acrylic acid, methacrylic acid, and crotonic acid; dicarboxylic acids such as maleic acid, fumaric acid, and itaconic acid; and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid, although of these, acrylic acid and methacrylic acid are preferred. These compounds may be used either alone, or in combinations of two or more different compounds.

The soluble polyimide refers to polyimides that can be converted to liquid form using an organic solvent.

If desired, other miscible additives can also be added to the organic film-forming material. Examples of such miscible additives include additive resins for improving the performance of the organic film, surfactants for improving the coating properties, dissolution inhibitors, plasticizers, stabilizers, colorants and halation prevention agents.

The organic film-forming material can be prepared by dissolving the materials such as the aforementioned resin component within an organic solvent. As the organic solvent, the same solvents as those exemplified above for the organic solvent of the aforementioned chemically amplified resist compositions may be used.

A hard mask layer formed from a silicon-based material may be used between the resist film and the organic film.

<<Negative Resist Composition>>

The negative resist composition of the present invention is a negative resist composition that can be used as a second resist composition within the method of forming a resist pattern that includes: forming a first resist film by applying a first resist composition to a support, forming a first resist pattern by selectively exposing the first resist film through a first mask pattern and then developing the first resist film, forming a second resist film by applying the second resist composition onto the support having the first resist pattern formed thereon, and forming a resist pattern by selectively exposing the second resist film through a second mask pattern and then developing the second resist film, wherein the negative resist composition contains an ether-based organic solvent (S″) having no hydroxyl groups.

This negative resist composition is preferably a chemically amplified resist composition, and is most preferably obtained by dissolving an alkali-soluble resin component (A″), an acid generator component (B) that generates acid upon exposure, and a cross-linker component (C) in the aforementioned ether-based organic solvent (S″).

This negative resist composition is the same as the negative resist composition used as the second resist composition in the method of forming a resist pattern according to the present invention described above.

Further, details relating to the "formation of a resist pattern" using the negative resist composition as the second resist composition are also the same as those described above in relation to each of the steps of the method of forming a resist pattern according to the present invention.

As described above, the present invention is able to provide a novel method of forming a resist pattern in which thickness loss from the resist pattern is reduced, and a negative resist composition that can be used in this method of forming a resist pattern.

Further, according to the method of forming a resist pattern according to the present invention, even when the negative resist composition is applied as the second resist composition to the surface of the first resist pattern formed using the first resist composition during the pattering step (1), there is no possibility of problems occurring where the organic solvent contained within the negative resist composition dissolves the first resist pattern, causing a deterioration in the pattern shape.

In a conventional double patterning method, when the second resist composition is applied to the first resist pattern formed using the first resist composition, the organic solvent of the latterly applied second resist composition tends to dissolve the first resist pattern, causing so-called mixing, which results in problems such as thickness loss from the resist pattern.

However, in the present invention, by using a combination of a positive resist composition as the first resist composition, and a negative resist composition containing a specific organic solvent (namely, an ether-based organic solvent having no hydroxyl groups) as the second resist composition, the first resist pattern is much less likely to dissolve in the organic solvent of the second resist composition, meaning thickness loss from the resist pattern is reduced, and enabling a resist pattern in which the shape of the first resist pattern has been favorably retained to be formed without any particular problems.

The reason that this effect is obtained is thought to be as follows. Namely, the ether-based organic solvent having no hydroxyl groups used in the present invention differs from alcohol-based solvents and the like in that it does not form hydrogen bonds with polar groups. Accordingly, when the negative resist composition containing this ether-based organic solvent is applied, even if large quantities of polar groups derived from the first resist composition exist at the surface of the first resist pattern, the ether-based organic solvent does not form hydrogen bonds with these polar groups, meaning the first resist pattern is less likely to dissolve in the solvent. It is thought that this is the reason that the present invention yields an effect that results in reduced thickness loss for the resist pattern Further, according to the present invention, the coatability of the negative resist composition onto the support having the first resist composition formed thereon is very favorable.

Furthermore, according to the method of forming a resist pattern of the present invention, there is no possibility of problems occurring where the second resist film formed using the negative resist composition dissolves in residual alkali developing solution left following formation of the first resist pattern, resulting in a deterioration in pattern shape.

Moreover, according to a method of forming a resist pattern of the present invention, very fine patterns can be formed using existing radiation sources of the same exposure wavelength, and using existing exposure apparatus and existing chemically amplified resist compositions.

EXAMPLES

Examples of the present invention are presented below, although the scope of the present invention is in no way limited by these examples.

<Evaluation of Thickness Loss During Resist Pattern Formation>

(Resin Component (A))

Resins (A)-1 and (A)-2 used in a positive resist composition, and a resin (A)-3 used in a negative resist composition are shown below.

[Chemical Formula 33]

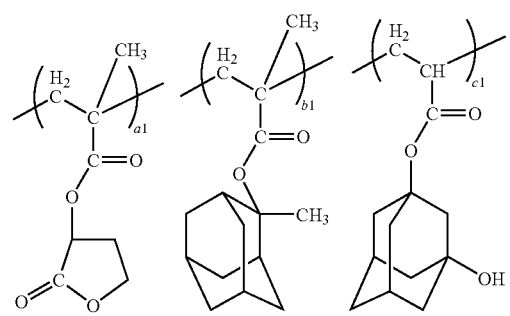

(A)-1

(a1/b1/c1=40/40/20 (molar ratio), Mw=10,000, Mw/Mn=1.7)

[Chemical Formula 34]

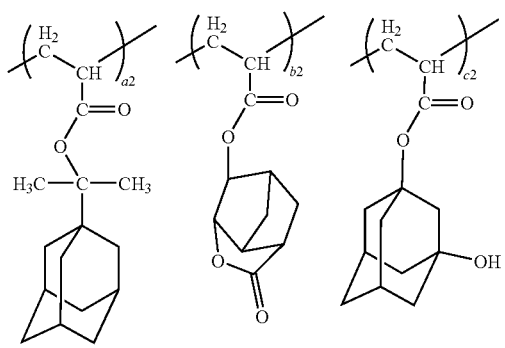
(A)-2

(a2/b2/c2=30/50/20 (molar ratio), Mw=10,000, Mw/Mn=2.7)

[Chemical Formula 35]

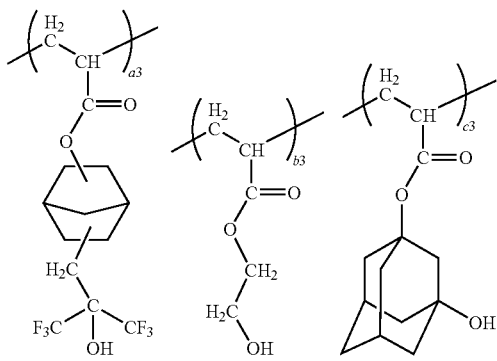
(A)-3

(a3/b3/c3=46/20/34 (molar ratio), Mw=6,200, Mw/Mn=1.57)

(Preparation of Resist Compositions)

The components shown in Table 1 were mixed and dissolved to prepare positive resist compositions and negative resist compositions. The positive resist compositions of example 1 and comparative example 1 are identical.

The meanings of the abbreviations used in Table 1 are as shown below. The numerical values within the brackets [ ] represent blend quantities (parts by weight).

(B)-1: triphenylsulfonium nonafluorobutanesulfonate (B)-2: a compound represented by chemical formula (B)-2 shown below.

[Chemical Formula 36]

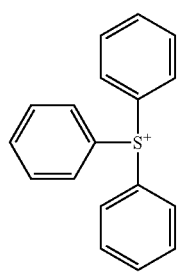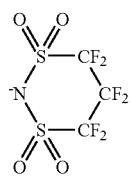
(B)-2

(B)-3: a compound represented by chemical formula (B)-3 shown below.

[Chemical Formula 37]

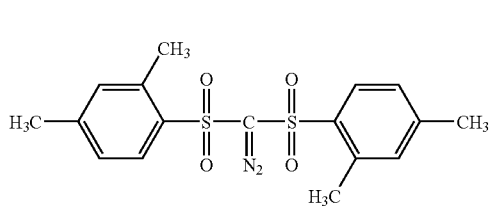
(B)-3

(C)-1: a compound represented by chemical formula (C)-1 shown below (product name: E-9401, manufactured by Sanwa Chemical Co., Ltd.).

TABLE 1

|  |  | Component (A) | | Component (B) | | Component (C) | Component (D) | Component (S) |
|---|---|---|---|---|---|---|---|---|
| Example 1 | Positive composition | (A)-1 [50] | (A)-2 [50] | (B)-1 [1.5] | (B)-2 [1.5] | — | (D)-1 [0.10] | (S)-1 [1300] |
|  | Negative composition | (A)-3 [100] | | (B)-3 [3.5] | | (C)-1 [5.88] | (D)-2 [0.40] | (S)-2 [1300] |
| Comparative example 1 | Positive composition | (A)-1 [50] | (A)-2 [50] | (B)-1 [1.5] | (B)-2 [1.5] | — | (D)-1 [0.10] | (S)-1 [1300] |
|  | Negative composition | (A)-3 [100] | | (B)-3 [3.5] | | (C)-1 [5.88] | (D)-2 [0.40] | (S)-3 [1300] |

[Chemical Formula 38]

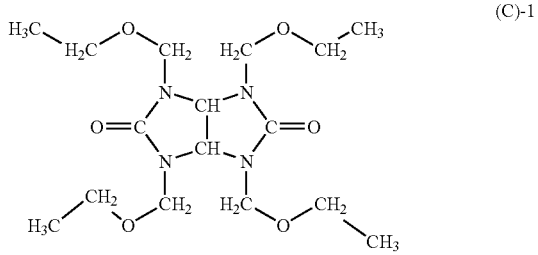

(C)-1

(D)-1: triethanolamine
(D)-2: triisopropanolamine
(S)-1: a mixed solvent of PGMEA/MAK=6/4 (weight ratio)
(S)-2: 1,8-cineole
(S)-3: isobutanol Using the positive resist compositions and negative resist compositions prepared above, evaluations of the thickness loss during resist pattern formation were conducted in the manner described below.

Example 1, Comparative Example 1

Using the sequence outlined below, resist patterns were formed using the same steps as those shown in FIG. 1.

In other words, an organic antireflective film composition ARC29 (a product name, manufactured by Brewer Science Ltd.) was applied onto an 8-inch silicon wafer using a spinner, and the composition was then baked and dried on a hotplate at 205° C. for 60 seconds, thereby forming an organic antireflective film having a film thickness of 77 nm.

The positive resist composition obtained above was applied onto the antireflective film using a spinner, and was then prebaked (PAB) and dried on a hotplate at 120° C. for 60 seconds, thereby forming a positive resist film having a film thickness of 200 nm.

Thereafter, using an ArF exposure apparatus NSR-S306A (manufactured by Nikon Corporation, NA (numerical aperture)=0.78, 2/3 annular illumination), the positive resist film was selectively irradiated with an ArF excimer laser (193 nm) through a mask pattern (a binary mask).

A PEB treatment was then conducted at 115° C. for 60 seconds, followed by development for 30 seconds at 23° C. in a 2.38% by weight aqueous solution of tetramethylammonium hydroxide (TMAH). The resist film was then rinsed for 30 seconds with pure water, and shaken dry. By subsequently drying the resist film at 100° C. for 60 seconds, a hole pattern having a hole diameter of 180 nm and a pitch of 360 nm (hereafter referred to as "pattern (1)") was formed.

Subsequently, a spinner was used to apply the negative resist composition of example 1 or comparative example 1 to the substrate having the pattern (1) formed thereon, and the composition was then prebaked (PAB) and dried on a hotplate at 80° C. for 60 seconds, thereby forming a negative resist film having a film thickness of 200 nm.

Thereafter, using an ArF exposure apparatus NSR-S302A (manufactured by Nikon Corporation, NA (numerical aperture)=0.60, σ=0.75), the resist film was selectively irradiated with an ArF excimer laser (193 nm) through a mask pattern (a binary mask).

A PEB treatment was then conducted at 100° C. for 60 seconds, followed by development for 30 seconds at 23° C. in a 2.38% by weight aqueous solution of tetramethylammonium hydroxide (TMAH). The resist film was then rinsed for 30 seconds with pure water, and shaken dry. By subsequently drying the resist film at 100° C. for 60 seconds, a resist pattern was formed.

Test Example 1

Following formation of the pattern (1), without applying the negative resist composition, the pattern (1) was subjected to the PAB treatment and the remaining steps under the same conditions as those described above.

Evaluation of the resist pattern shape of each of the resist patterns obtained following the treatment described above by inspection using a measuring SEM (product name: S-9220, manufactured by Hitachi, Ltd.) confirmed that when the negative resist composition of example 1 was used, almost no thickness loss occurred from the pattern (1), and moreover the shape of the pattern (1) was as favorable as the resist pattern shape (the hole pattern shape) formed in the test example 1.

In contrast, when the negative resist composition of comparative example 1 was used, thickness loss from the pattern (1) was considerable, and the shape of the pattern (1) was inferior to the shape obtained in the test example 1, confirming that some collapse of the pattern had occurred.

From the above results it was clear that by using the method of forming a resist pattern of the present invention, which used the negative resist composition of example 1, thickness loss from the resist pattern was reduced.

<Evaluation of Thickness Loss from Polymer Films in Various Organic Solvents>

As shown below in Table 2, based on a resin (A)-4 shown below, resins (A41 to A45) having different combinations of the substituents ($R^a$, $R^b$ and $R^e$) bonded to the α-position carbon atom within each structural unit, and resins (A46 to A48) having the same combination of the above substituents but having different weight average molecular weight values were each dissolved in a mixed solvent of PGMEA/MAK=6/4 (weight ratio), thus forming a series of resin solutions each having a resin concentration (a solid fraction) of 5% by weight.

Each of the thus obtained resin solutions was applied to an 8-inch silicon wafer using a spin coater, and was then subjected to a prebake (PAB) treatment at 100° C. for 90 seconds, and then dried, thus forming a polymer film with a film thickness of 150 nm. The film thickness was measured using a NANOSPEC 210XP (a product name, manufactured by Nanometrics Incorporated).

Subsequently, 4 to 5 ml of each of the organic solvents (S1 to S9) was applied to the polymer film and left to stand.

Following spin drying, the film thickness of the polymer film as re-measured in the same manner as that described above. The results are shown in FIG. 2A and FIG. 2B.

Figure 2A:
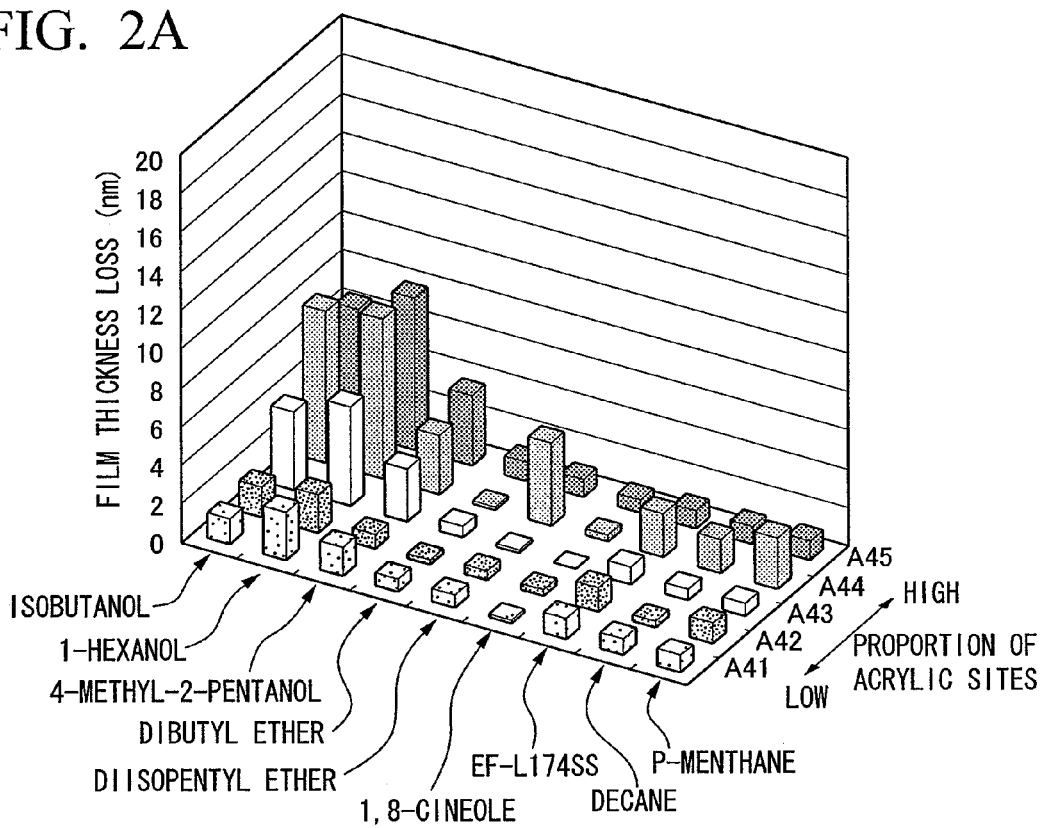
FIG. 2A is a graph showing the results of evaluating the thickness loss from a polymer film in a variety of organic solvents, and shows the change in the film thickness (nm) of the polymer film due to differences in the proportion of acrylic sites within the resin.
Figure 2B:
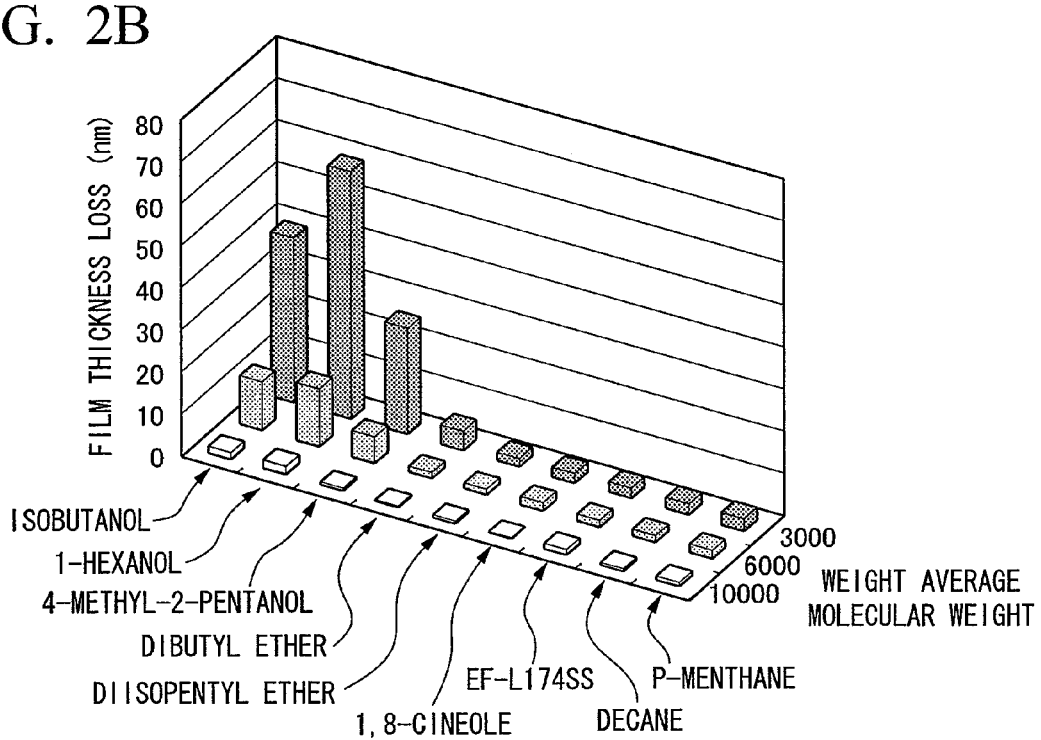
FIG. 2B is a graph showing the results of evaluating the thickness loss from a polymer film in a variety of organic solvents, and shows the change in the film thickness (nm) of the polymer film due to differences in the weight average molecular weight of the resin.

FIG. 2A is a graph showing the change in the film thickness (nm) of the polymer film due to differences in the proportion of acrylic sites within the resin, and FIG. 2B is a graph showing the change in the film thickness (nm) of the polymer film due to differences in the weight average molecular weight of the resin.

For the resin (A)-4, a comparison of the resins having a weight average molecular weight of 10,000 shows that the proportion of acrylic sites within the resin increases in the order A41→A42→A43→A44→A45.

[Chemical Formula 39]

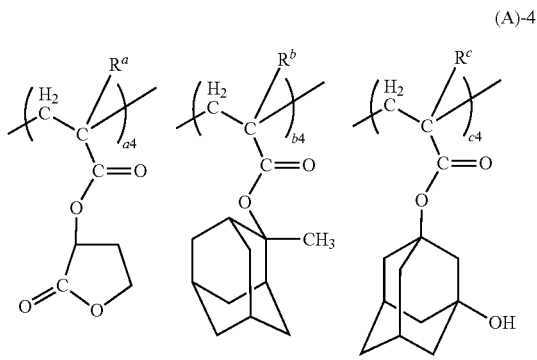

(a4/b4/c4=40/40/20 (molar ratio))

TABLE 2

| | (A)-4 | | | | |
|---|---|---|---|---|---|
| | $R^a$ | $R^b$ | $R^c$ | Mw | Mw/Mn |
| A41 | $CH_3$ | $CH_3$ | $CH_3$ | 10,000 | 1.7 |
| A42 | $CH_3$ | $CH_3$ | H | 10,000 | 1.7 |
| A43 | H | $CH_3$ | $CH_3$ | 10,000 | 1.7 |
| A44 | H | $CH_3$ | H | 10,000 | 1.7 |
| A45 | H | H | $CH_3$ | 10,000 | 1.7 |
| A46 | $CH_3$ | $CH_3$ | H | 10,000 | 1.7 |
| A47 | $CH_3$ | $CH_3$ | H | 6,000 | 2.2 |
| A48 | $CH_3$ | $CH_3$ | H | 3,000 | 2.4 |

The meanings of the abbreviations used in Table 2 are as shown below.
$R^a$ to $R^c$: the substituent on the α-position carbon atom for each of the structural units in the above resin (A)-4.
S1: isobutanol
S2: 1-hexanol
S3: 4-methyl-2-pentanol
S4: dibutyl ether
S5: diisopentyl ether
S6: 1,8-cineole
S7: the compound represented by chemical formula $N(C_3F_7)_3$ (product name: EF-L174SS, manufactured by Jemco Inc.)
S8: decane
S9: p-menthane From FIG. 2A it is clear that for S1 to S3 (alcohol-based organic solvents), the thickness loss from the polymer film increased as the proportion of acrylic sites within the resin that constituted the polymer film increased.

In contrast, for S4 to S6 (ether-based organic solvents), S7 (fluorine-based organic solvent) and S8 to S9 (hydrocarbon-based organic solvents), the thickness loss from the polymer film was considerably less than that observed for S1 to S3.

From FIG. 2B it is clear that for S1 to S3, the thickness loss from the polymer film increased as the weight average molecular weight of the resin that constituted the polymer film decreased.

In contrast, for S4 to S6, S7, and S8 to S9, the thickness loss from the polymer film was less than that observed for S1 to S3 in every case.

On the other hand, among the solvents S4 to S6, S7, and S8 to S9, S4 to S6 exhibit favorable dissolution of resist materials, whereas S7, S8 and S9 exhibit inferior dissolution of resist materials.

Accordingly, it was confirmed that S4 to S6 (ether-based organic solvents) were ideal as the organic solvent for the negative resist composition used in the method of forming a resist pattern according to the present invention.

INDUSTRIAL APPLICABILITY

The present invention is able to provide a novel method of forming a resist pattern in which thickness loss from the resist pattern is reduced, and a negative resist composition that can be used in this method of forming a resist pattern, and is therefore extremely useful industrially.

The invention claimed is:
1. A method of forming a resist pattern, comprising:
forming a first resist film by applying a first resist composition to a support,
forming a first resist pattern by selectively exposing said first resist film through a first mask pattern and then developing said first resist film,
forming a second resist film by applying a negative resist composition comprising a solvent consisting of an ether-based organic solvent (S") having no hydroxyl groups, wherein said solvent is at least one solvent selected from the group consisting of 1,8-cineole, dibutyl ether, and diisopentyl ether, onto said support having said first resist pattern formed thereon, and
forming a resist pattern by selectively exposing said second resist film through a second mask pattern and then developing said second resist film,
wherein said negative resist composition is prepared by dissolving an alkali-soluble resin component (A") comprising a resin(A2) unit containing an aliphatic cyclic group having a fluorinated hydroxyalkl group and a structural unit derived from an acrylate ester containing a hydroxyl group-containing aliphatic cyclic group, an acid generator component (B) that generates acid upon exposure, and a cross-linker component (C) in said ether-based organic solvent (S").

2. A method of forming a resist pattern according to claim 1, wherein said first resist composition is a positive resist composition comprising a base component (A') that exhibits increased alkali solubility under action of acid, and an acid generator component (B) that generates acid upon exposure.

3. A method of forming a resist pattern according to claim 2, wherein said base component (A') comprises a resin (A-12) comprising a structural unit derived from an acrylate ester containing an acid-dissociable, dissolution-inhibiting group.

4. A method of forming a resist pattern according to claim 3, wherein said resin (A-12) further comprises a structural unit derived from an acrylate ester containing a lactone-containing cyclic group.

5. A method of forming a resist pattern according to claim 3, wherein said resin (A-12) further comprises a structural unit derived from an acrylate ester containing a polar group-containing aliphatic hydrocarbon group.

6. The method of forming a resist pattern according to claim 2, wherein said first resist composition further comprises a nitrogen-containing organic compound (D).

7. A method of forming a resist pattern according to claim 1, wherein said resin (A2) further comprises a structural unit derived from an acrylic acid that has no cyclic structure and has an alcoholic hydroxyl group on a side chain.

8. A method of forming a resist pattern according to claim 1, wherein said cross-linker component (C) is at least one cross-linker selected from the group consisting of melamine-based cross-linkers, urea-based cross-linkers, alkylene urea-based cross-linkers and glycoluril-based cross-linkers.

9. A method of forming a resist pattern according to claim 1, wherein said negative resist composition further comprises a nitrogen-containing organic compound (D).

10. A method of forming a resist pattern, comprising:
forming a first resist film by applying a first resist composition to a support,
forming a first resist pattern by selectively exposing said first resist film through a first mask pattern and then developing said first resist film,
forming a second resist film by applying a negative resist composition comprising a solvent consisting of an ether-based organic solvent (S") having no hydroxyl groups, wherein said solvent is at least one solvent selected from the group consisting of 1,8-cineole, dibutyl ether, and diisopentyl ether, onto said support having said first resist pattern formed thereon, and
forming a resist pattern by selectively exposing said second resist film through a second mask pattern and then developing said second resist film,
wherein said negative resist composition is prepared by dissolving an alkali-soluble resin component (A") comprising a resin (A2) comprising a structural unit containing an aliphatic cyclic group having a fluorinated hydroxyalkyl group and a structural unit derived from an acrylic acid that has no cyclic structure and has an alcoholic hydroxyl group on a side chain, an acid generator component (B) that generates acid upon exposure, and a cross-linker component (C) in said ether-based organic solvent (S").

11. A method of forming a resist pattern according to claim 10, wherein said first resist composition is a positive resist composition comprising a base component (A') that exhibits increased alkali solubility under action of acid, and an acid generator component (B) that generates acid upon exposure.

12. A method of forming a resist pattern according to claim 11, wherein said base component (A') comprises a resin (A-12) comprising a structural unit derived from an acrylate ester containing an acid-dissociable, dissolution-inhibiting group.

13. A method of forming a resist pattern according to claim 12, wherein said resin (A-12) further comprises a structural unit derived from an acrylate ester containing a lactone-containing cyclic group.

14. A method of forming a resist pattern according to claim 12, wherein said resin (A-12) further comprises a structural unit derived from an acrylate ester containing a polar group-containing aliphatic hydrocarbon group.

15. A method of forming a resist pattern, comprising:
forming a first resist film by applying a first resist composition to a support,
forming a first resist pattern by selectively exposing said first resist film through a first mask pattern and then developing said first resist film,
forming a second resist film by applying a negative resist composition comprising a solvent consisting of an ether-based organic solvent (S") having no hydroxyl groups, wherein said solvent is at least one solvent selected from the group consisting of 1,8-cineole, dibutyl ether, and diisopentyl ether, onto said support having said first resist pattern formed thereon, and
forming a resist pattern by selectively exposing said second resist film through a second mask pattern and then developing said second resist film,
wherein said negative resist composition is prepared by dissolving an alkali-soluble resin component (A"), an acid generator component (B) that generates acid upon exposure, and a cross-linker component (C) in said ether-based organic solvent (S"), wherein said cross-linker component (C) is at least one cross-linker selected from the group consisting of melamine-based cross-linkers, urea-based cross-linkers, alkylene urea-based cross-linkers and glycoluril-based cross-linkers.

16. A method of forming a resist pattern according to claim 15, wherein said first resist composition is a positive resist composition comprising a base component (A') that exhibits increased alkali solubility under action of acid, and an acid generator component (B) that generates acid upon exposure.

17. A method of forming a resist pattern according to claim 16, wherein said base component (A') comprises a resin (A-12) comprising a structural unit derived from an acrylate ester containing an acid-dissociable, dissolution-inhibiting group.

18. A method of forming a resist pattern according to claim 17, wherein said resin (A-12) further comprises a structural unit derived from an acrylate ester containing a lactone-containing cyclic group.

19. A method of forming a resist pattern according to claim 17, wherein said resin (A-12) further comprises a structural unit derived from an acrylate ester containing a polar group-containing aliphatic hydrocarbon group.

* * * * *

UNITED STATES PATENT AND TRADEMARK OFFICE
CERTIFICATE OF CORRECTION

PATENT NO. : 8,859,187 B2
APPLICATION NO. : 12/438906
DATED : October 14, 2014
INVENTOR(S) : Ken Tanaka, Sho Abe and Shigeru Yokoi It is certified that error appears in the above-identified patent and that said Letters Patent is hereby corrected as shown below:

In the Specification

At Column 1, Lines 20-25 (Approx.), Above "BACKGROUND ART" delete "Priority is claimed on Japanese Patent Application No. 2006-286465, filed Oct. 20, 2006, the content of which is incorporated herein by reference. Priority is claimed on Japanese Patent Application No. 2006-286465, filed Oct. 20, 2006, the content of which is incorporated herein by reference.".

At Column 8, Line 1, Change "alkyl) acrylate" to --alkyl)acrylate--.

At Column 15, Line 20, Change "C-position" to --α-position--.

At Column 15, Line 38, Change "industrially" to --industrially.--.

At Column 23, Line 37, Change "naphthyl) sulfonium" to --naphthyl)sulfonium--.

At Column 29, Line 45, Change "carbon" to --5 carbon--.

At Column 44, Line 11 (Approx.), Change "(A')." to --(A'')." --.

At Column 47, Line 44, Change "(A')." to --(A'')." --.

At Column 56, Line 18 (Approx.), Change "pattern" to --pattern.--.

At Column 60, Line 37 (Approx.), Change "$R^e$)" to --$R^c$)--.

In the Claims

At Column 62, Line 32, In Claim 1, change "resin(A2)" to --resin (A2) comprising a structural--.

At Column 62, Line 33, In Claim 1, change "hydroxyalkl" to --hydroxyalkyl--.

Signed and Sealed this
Thirtieth Day of June, 2015

Michelle K. Lee
*Director of the United States Patent and Trademark Office*